United States Patent
Yasuda et al.

(10) Patent No.: US 11,586,882 B2
(45) Date of Patent: Feb. 21, 2023

(54) SYNAPSE MEMORY

(71) Applicant: INTERNATIONAL BUSINESS MACHINES CORPORATION, Armonk, NY (US)

(72) Inventors: Takeo Yasuda, Nara (JP); Kohji Hosokawa, Ohtsu (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1431 days.

(21) Appl. No.: 15/878,965

(22) Filed: Jan. 24, 2018

(65) Prior Publication Data

US 2019/0228292 A1   Jul. 25, 2019

(51) Int. Cl.
*G06N 3/063* (2006.01)
*G06N 3/04* (2006.01)
(Continued)

(52) U.S. Cl.
CPC .......... *G06N 3/063* (2013.01); *G06N 3/04* (2013.01); *G11C 11/1659* (2013.01);
(Continued)

(58) Field of Classification Search
CPC ...... G06N 3/063; G06N 3/04; G11C 11/1673; G11C 11/1675
See application file for complete search history.

(56) References Cited

U.S. PATENT DOCUMENTS

| 5,986,925 A * | 11/1999 | Naji | G11C 11/15 365/158 |
| 9,613,668 B2 * | 4/2017 | Kikuchi | G11C 7/1006 |

(Continued)

FOREIGN PATENT DOCUMENTS

| CN | 104240753 A | 12/2014 |
| CN | 107194462 A | 9/2017 |
| JP | 2018508922 A | 3/2018 |

OTHER PUBLICATIONS

R. Hasan and T. M. Taha, "Enabling back propagation training of memristor crossbar neuromorphic processors," 2014 International Joint Conference on Neural Networks (IJCNN), 2014, pp. 21-28, doi: 10.1109/IJCNN.2014.6889893. (Year: 2014).*

(Continued)

*Primary Examiner* — Kakali Chaki
*Assistant Examiner* — Michael H Hoang
(74) *Attorney, Agent, or Firm* — Tutunjian & Bitetto, P.C.; Randy Emilio Tejeda

(57) ABSTRACT

A synapse memory and a method for reading a weight value stored in a synapse memory are provided. The synapse memory includes a memory device configured to store a weight value. The memory device includes a read terminal, a write terminal, and a common terminal, the read terminal being configured to receive a read signal, the write terminal being configured to receive a write signal, and the common terminal being configured to output an output signal from the memory device. The synapse memory also includes a write transistor provided between the write terminal of the memory device and a write signal line configured to send the (Continued)

write signal. The synapse memory further includes a common transistor provided between the common terminal of the memory device and one of the dendrite lines.

13 Claims, 18 Drawing Sheets

(51) Int. Cl.
    *G11C 11/16*    (2006.01)
    *G11C 11/54*    (2006.01)

(52) U.S. Cl.
    CPC ...... *G11C 11/1673* (2013.01); *G11C 11/1675* (2013.01); *G11C 11/54* (2013.01)

(56) References Cited

U.S. PATENT DOCUMENTS

| | | | |
|---|---|---|---|
| 2010/0299297 A1* | 11/2010 | Breitwisch | G11C 13/0004 706/33 |
| 2011/0119215 A1 | 5/2011 | Elmegreen et al. | |
| 2012/0084241 A1* | 4/2012 | Friedman | G11C 11/54 706/27 |
| 2013/0070521 A1 | 3/2013 | El Baraji et al. | |
| 2015/0117090 A1 | 4/2015 | Kim et al. | |
| 2016/0125287 A1 | 5/2016 | Pantazi et al. | |
| 2016/0203400 A1 | 7/2016 | Kim et al. | |
| 2017/0185890 A1 | 6/2017 | Yasuda et al. | |

OTHER PUBLICATIONS

G. Papandroulidakis, I. Vourkas, A. Abusleme, G. C. Sirakoulis and A. Rubio, "Crossbar-Based Memristive Logic-in-Memory Architecture," in IEEE Transactions on Nanotechnology, vol. 16, No. 3, pp. 491-501, May 2017, doi: 10.1109/TNAN0.2017.2691713. (Year: 2017).*

Ramakrishnan, Shubha, et al. "Neuron array with plastic synapses and programmable dendrites." IEEE transactions on biomedical circuits and systems 7.5 (2013): 631-642. https://ieeexplore.ieee.org/stamp/stamp.jsp?tp=&arnumber=6637106 (Year: 2013).*

International Search Report Issued in IB2019/050185 dated Apr. 28, 2019, 9 pages.

European Search Report Issued in 19743520.9 dated Feb. 4, 2021, 9 pages.

Sengupta, "Hybrid Spintronic-CMOS Spike Neural Network with On-Chip Learning: Devices, Circuits and Systems", arXiv:1510.00432v4, Nov. 4, 2016 pp. 1-13.

Kim "Spin-Based Computing: Device Concepts, Current Status, and a Case Study on a High-Performance Microprocessor", Proceedings of the IEEE, vol. 103, No. 1, Jan. 2015, pp. 106-130.

Decision to Grant Patent Issued in corresponding Japanese Patent Application No. 2020-537730 dated Jun. 4, 2022, 2 pages.

European Examination Report Issued in 19743520.9 dated Jun. 17, 2022, 9 pages.

* cited by examiner

NORMAL DIRECTION READ

NORMAL DIRECTION READ

REVERSE DIRECTION READ

NORMAL INCREMENT WRITE

NORMAL INCREMENT WRITE

NORMAL DECREMENT WRITE

NORMAL DECREMENT WRITE

NORMAL DIRECTION READ

NORMAL DIRECTION READ

NORMAL WRITE

NORMAL WRITE

REVERSE DIRECTION READ

SYNAPSE MEMORY

BACKGROUND

Technical Field

The present invention relates to a synapse memory.

Description of the Related Art

Recently, various techniques have been known regarding a synapse memory.

SUMMARY

According to an embodiment of the present invention, there is provided a synapse memory. The synapse memory includes plural synapse memory cells provided at cross points of plural axon lines and plural dendrite lines. Each synapse memory cell includes a memory device, a write transistor, and a common transistor. The memory device is configured to store a weight value, and is provided with a read terminal, a write terminal, and a common terminal. The read terminal is configured to receive a read signal to read the weight value stored in the memory device. The write terminal is configured to receive a write signal to write the weight value to the memory device. The common terminal is configured to output an output signal from the memory device or input an input signal to the memory device having received the read signal or the write signal, respectively. The write transistor is provided between the write terminal of the memory device and a write signal line configured to send the write signal. The common transistor is provided between the common terminal of the memory device and one of the dendrite lines.

According to another embodiment of the present invention, there is provided a synapse memory. The synapse memory includes plural synapse memory cells provided at cross points of plural axon lines and plural dendrite lines. Each synapse memory cell includes a memory device and a switch. The memory device is configured to store a weight value, and is provided with a read terminal, a write terminal, and a common terminal. The read terminal is configured to receive a read signal to read the weight value stored in the memory device. The write terminal is configured to receive a write signal to write the weight value to the memory device. The common terminal is configured to output an output signal from the memory device or input an input signal to the memory device having received the read signal or the write signal, respectively. The switch is configured to switch connection and disconnection between one of the dendrite lines and the common terminal of the memory device. If the weight value stored in a part of the plural synapse memory cells is to be read, each switch provided in the part of the plural synapse memory cells connects the one of the dendrite lines and the common terminal of the memory device, and each switch provided in the other part of the plural synapse memory cells disconnects the one of the dendrite lines and the common terminal of the memory device.

According to yet another embodiment of the present invention, there is provided a device including a synapse memory. The synapse memory includes plural synapse memory cells provided at cross points of plural axon lines and plural dendrite lines. Each synapse memory cell includes a memory device, a write transistor, and a common transistor. The memory device is configured to store a weight value, and is provided with a read a write terminal, and a common terminal. The read terminal is configured to receive a read signal to read the weight value stored in the memory device. The write terminal is configured to receive a write signal to write the weight value to the memory device. The common terminal is configured to output an output signal from the memory device or input an input signal to the memory device having received the read signal or the write signal, respectively. The write transistor is provided between the write terminal of the memory device and a write signal line configured to send the write signal. The common transistor is provided between the common terminal of the memory device and one of the dendrite lines.

According to yet another embodiment of the present invention, there is provided a synapse memory. The synapse memory includes plural synapse memory cells provided at cross points of plural axon lines and plural dendrite lines. Each synapse memory cell includes a memory device, a write transistor, a common transistor, a read transistor. The memory device is configured to store a weight value, and is provided with a read terminal, a write terminal, and a common terminal. The read terminal is configured to receive a read signal to read the weight value stored in the memory device. The write terminal is configured to receive a write signal to write the weight value to the memory device. The common terminal is configured to output an output signal from the memory device or input an input signal to the memory device having received the read signal or the write signal, respectively. The write transistor is provided between the write terminal of the memory device and a write signal line configured to send the write signal. The common transistor is provided between the common terminal of the memory device and one of the dendrite lines. The read transistor is provided between the read terminal of the memory device and one of the axon lines. A first subgroup of the synapse memory cells is connected in common to one of the axons. A second subgroup of the synapse memory cells is connected in common to one of the dendrite lines. A gate of the common transistor provided in each of the first subgroup of the synapse memory cells is connected in common to a common control line configured to send a common transistor control signal. A gate of the write transistor provided in each of the second sub-plural synapse memory cells is connected in common to one of the write control lines. A gate of the read transistor provided in each of the second subgroup of the synapse memory cells is connected in common to a read signal line configured to send a read transistor control signal.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Hereinafter, exemplary embodiments of the present invention will be described in detail with reference to the attached drawings.

It is to be noted that the present invention is not limited to these exemplary embodiments to be given below and may be implemented with various modifications within the scope of the present invention. In addition, the drawings used herein are for purposes of illustration, and may not show actual dimensions.

Figure 1:
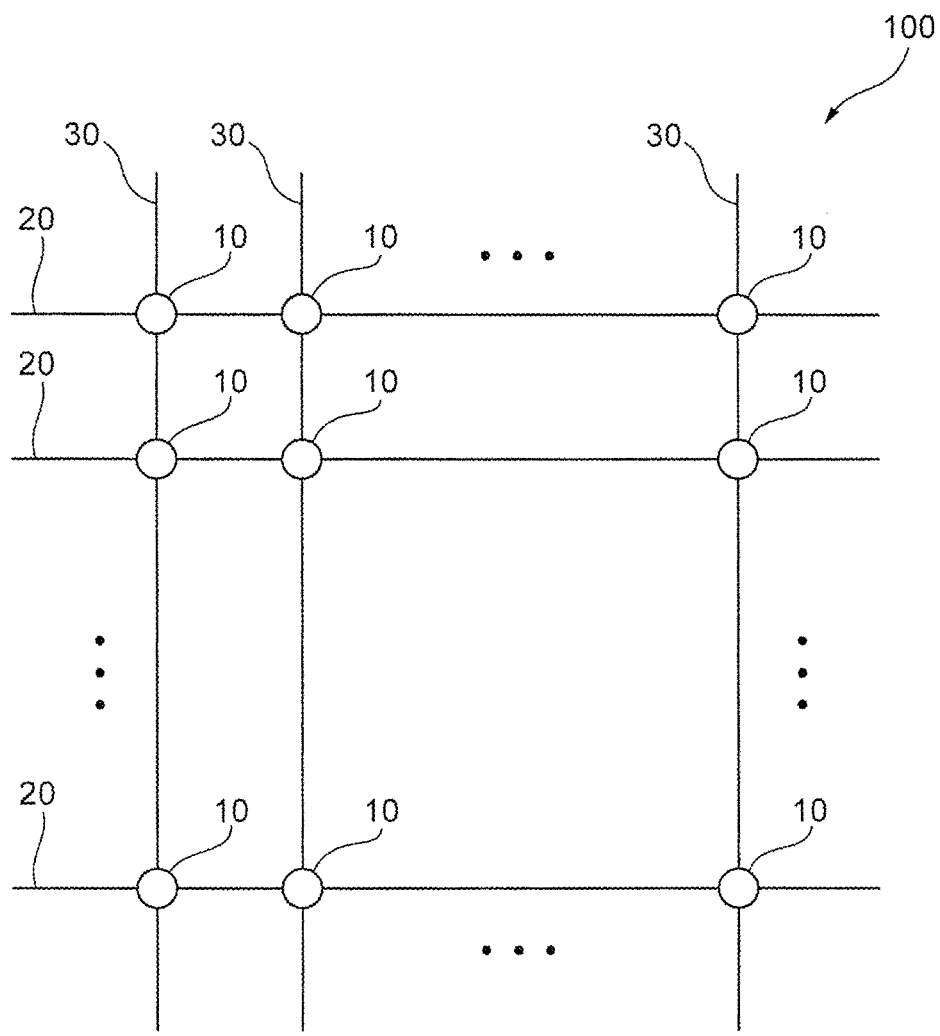
FIG. 1 depicts a synapse memory having a cross-bar array according to an exemplary embodiment of the present invention.

FIG. 1 depicts a synapse memory 100 having a cross-bar array according to an exemplary embodiment of the present invention.

Hardware implementation of a neuromorphic system may include synapse memories as well as neuron bodies and network connection with axons and dendrites. As shown in FIG. 1, the synapse memory 100 may include synapse memory cells 10 arranged/placed at all cross points of all axons (axon lines) 20 and all dendrites (dendrite lines) 30. Each of the synapse memory cells 10 may be configured to store a synapse weight value, which indicates a weight of synapse connection of the corresponding synapse memory cell 10. Note that the axons 20 correspond to respective axons of pre-neurons and the dendrites 30 correspond to respective dendrites of post-neurons.

In the present exemplary embodiment, the synapse memory cell 10 may include a memory device MD (see FIG. 3) to store the synapse weight value. The memory device MD may be a magnetoresistive random access memory (MRAM). For example, the memory device MD may be a spin transfer torque magnetoresistive random access memory (STT-MRAM).

Writing data to the memory device MD is executed by applying a voltage or a current to the memory device MD. The memory device MD can store a continuous value (analog value) or a multi-value (discrete value). Controlling the voltage value or the current value to be applied to the memory device MD enables to control the synapse weight value stored in the memory device MD. Note that the memory device MD can be used as an analog memory. In other words, the memory device MD can store and hold a value being one of at least three kinds of values. The memory device MD may have continuous mid-range resistance values, not only two very large and very small values.

Figure 2:
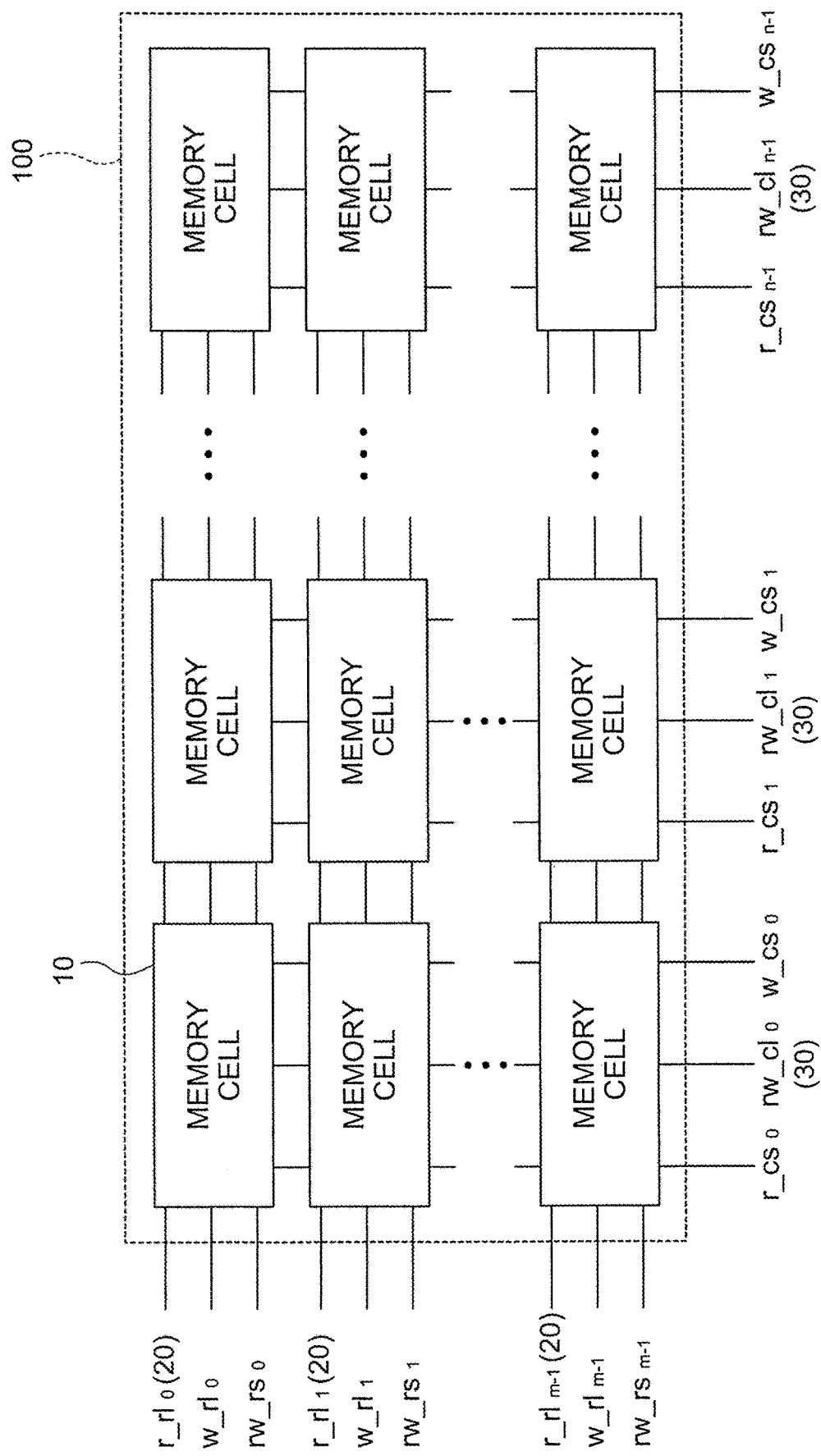
FIG. 2 depicts a synapse memory according to the exemplary embodiment.

FIG. 2 depicts a synapse memory 100 according to the exemplary embodiment.

As shown in FIG. 2, the synapse memory 100 may include the synapse memory cells 10 arranged in an array of m×n (m rows and n columns). The synapse memory 100 may also include lines extending along a row direction (the horizontal direction in FIG. 2) and lines extending along a column direction (the vertical direction in FIG. 2) to connect the synapse memory cells 10 to each other.

Here, the row lines include read-row lines $r\_rl_0$-$r\_rl_{m-1}$, write-row lines $w\_rl_0$-$w\_rl_{m-1}$, and read-write-row selects $rw\_rs_0$-$rw\_rs_{m-1}$. Note that the read-row lines $r\_rl_0$-$r\_rl_{m-1}$ correspond to the axons 20. That is to say, the write-row lines $w\_rl_0$-$w\_rl_{m-1}$ and the read-write-row selects $rw\_rs_0$-$rw\_rs_{m-1}$ are extending along the axons 20. The column lines include read-column selects $r\_cs_0$-$r\_cs_{n-1}$, write-column selects $w\_cs_0$-$w\_cs_{n-1}$, and read-write-column lines $rw\_cl_0$-$rw\_cl_{n-1}$. Note that the read-write-column lines $rw\_cl_0$-$rw\_cl_{n-1}$ correspond to the dendrites 30. That is to say, the read-column selects $r\_cs_0$-$r\_cs_{n-1}$ and the write-column selects $w\_cs_0$-$w\_cs_{n-1}$ are extending along the dendrites 30. Further, the read-write-row selects $rw\_rs_0$-$rw\_rs_{m-1}$, the read-column selects $r\_cs_0$-$r\_cs_{n-1}$, and the write-column selects $w\_cs_0$-$w\_cs_{n-1}$ are lines for signals to switch the circuits of the synapse memory cells 10. Details of each line will be descried later.

Here, the synapse memory 100 performs read operation and write operation using the row lines and the column lines. In other words, the synapse memory 100 requires the row lines and the column lines to perform read and write accesses to each synapse memory cell 10.

The read operation for the synapse memory cell 10 is performed with multiple concurrent axon lines' (the row lines') activation to read a total current at one dendrite line. That is to say, in the read operation of the synapse weight value, a total synapse weight value is read for each dendrite 30. The total synapse weight value is a sum of the synapse weight values of the respective synapse memory cells 10 which are selected to be read.

Here, if array size of the synapse memory 100 is large (e.g. 1024×1024), the number of unselected synapse memory cell(s) 10, which is connected all in parallel, will be large. This may cause read disturb for the selected synapse memory cell(s) 10. The term "read disturb" may refer to an influence of the unselected synapse memory cell(s) on a result of the read operation. The unselected synapse memory cell(s) 10 is provided on the same dendrite 30 selected to be read in the read operation, as the selected synapse memory cell(s) 10.

Figure 3:
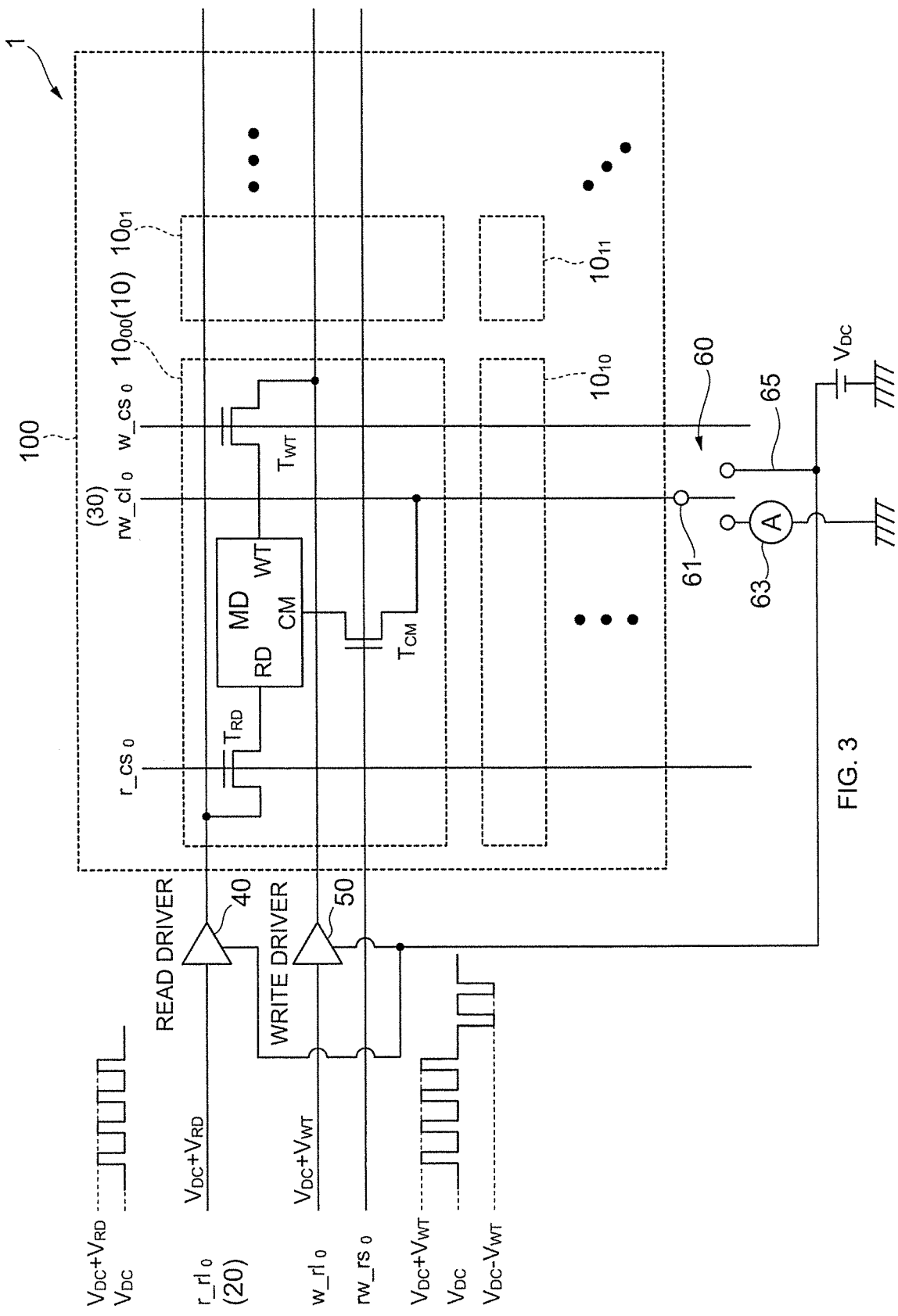
FIG. 3 depicts a synapse memory cell system according to the exemplary embodiment.

FIG. 3 depicts a synapse memory cell system 1 according to the exemplary embodiment. In the following explanation, the synapse memory cell $10_{00}$ will be described as an example. The other synapse memory cells 10 (e.g. synapse memory cells $10_{10}$, $10_{01}$, $10_{11}$) are configured similarly to the synapse memory cell $10_{00}$.

As shown in FIG. 3, the synapse memory cell system 1 may include the synapse memory 100, read drivers 40, write drivers 50, and switching portions 60. The synapse memory cell system 1 can be a neuromorphic system on silicon. This exemplary embodiment assumes that writing the synapse weight value to the memory device MD included in the synapse memory 100 is executed by controlling the voltage value.

Here, as mentioned above referring to FIG. 1, the synapse memory 100 has the cross-bar array of the axons 20 and the dendrites 30, and includes the synapse memory cells 10 arranged at all cross points of the axons 20 and the dendrites 30. Each of the synapse memory cells 10 may include the memory device MD and three transistors, namely: a read transistor $T_{RD}$; a write transistor $T_{WT}$; and a common transistor $T_{CM}$. The three transistors are elements for switching circuits of the memory device MD (the synapse memory cell 10).

The memory device MD, i.e. the MRAM, may be provided with three independent ports. In other words, the memory device MD may be a three terminal device. Specifically, the memory device MD is provided with a read terminal RD, a write terminal WT, and a common terminal CM. The read terminal RD receives a read signal from the read driver 40. The write terminal WT receives a write signal from the write driver 50. The common terminal CM outputs a signal (output signal) from the memory device MD that has received the read signal or input a signal (input signal) to the memory device MD that has received the write signal.

The three transistors, i.e. the read transistor $T_{RD}$, the write transistor $T_{WT}$, and the common transistor $T_{CM}$, are respectively provided on the read terminal RD, the write terminal WT, and the common terminal CM. In other words, the three transistors are provided between ports of the memory device MD and row and column access lines.

For example, in the synapse memory cell $10_{00}$, the read transistor $T_{RD}$ is provided between the read terminal RD and the read-row line $r\_rl_0$. The gate of the read transistor $T_{RD}$ is connected to the read-column select $r\_cs_0$. The read transistor $T_{RD}$ connects/disconnects the read terminal RD and the read-row line $r\_rl_0$. The write transistor $T_{WT}$ is provided between the write terminal WT and the write-row line $w\_rl_0$. The gate of the write transistor $T_{WT}$ is connected to the write-column select $w\_cs_0$. The write transistor $T_{WT}$ connects/disconnects the write terminal WT and the write-row line $w\_rl_0$. The common transistor $T_{CM}$ is provided between the common terminal CM and the read-write-column line $rw\_cl_0$. The gate of the common transistor $T_{CM}$ is connected to the read-write-row select $rw\_rs_0$. The common transistor $T_{CM}$ connects/disconnects the common terminal CM and the read-write-column line $rw\_cl_0$. The write-column select $w\_cs_0$ is an example of the claimed write control line. The read-write-row select $rw\_rs_0$ is an example of the claimed common control line. The read-column select $r\_cs_0$ is an example of the claimed read signal line.

A transistor driver (not shown) applies the voltage to the respective three transistors via the read-column select $r\_cs_0$, the write-column select $w\_cs_0$, and the read-write-row select $rw\_rs_0$. In the shown example, the applied voltage to the gates of the respective three transistors is switched between a high voltage $V_H$ and a low voltage $V_L$. If the high voltage $V_H$ is applied to the gate, the transistor is turned ON, i.e. in a zero resistance state. If the low voltage $V_L$ is applied to the gate, the transistor is turned OFF, i.e. in a high impedance (Hi-Z) state. That is to say, the three transistors independently connect/disconnect the memory device MD and the lines, i.e. the read-row line $r\_rl_0$, the write-row line $w\_rl_0$, and the read-write-column line $rw\_cl_0$. Note that applying the voltage to the gate means assigning a control signal to the transistor. The applied voltage to the gate may define control timing and levels which implement read and write access. The applied voltage to the gate of the common transistor $T_{CM}$ is an example of the claimed common transistor control signal. The applied voltage to the gate of the read transistor $T_{RD}$ is an example of the claimed read transistor control signal.

The read driver 40 is connected to the synapse memory cells 10 via the read-row line $r\_rl_0$ (the axon 20). The read driver 40 may be configured to read the synapse weight value from the synapse memory cells 10 in response to a recognition operation input. In the example shown in the figure, the read driver 40 may be a digital driver to apply the voltage of a supply voltage $V_{DC}$ or a read drive voltage $V_{DC}+V_{RD}$ to the read-row line $r\_rl_0$.

The write driver 50 is connected to the synapse memory cells 10 via the write-row line $w\_rl_0$. The write driver 50 may be configured to write (update) the synapse weight value to the respective synapse memory cells 10 in response to a learning operation input. In the shown example in the figure, the write driver 50 may be a digital or analog driver to apply the voltage of the supply voltage $V_{DC}$, an increment write voltage $V_{DC}+V_{WT}$, or a decrement write voltage $V_{DC}-V_{WT}$ to the write-row line $w\_rl_0$.

To update the weight to be stored in the respective synapse memory cells 10 in the synapse memory 100 may be referred to as learning. The learning may include online learning and offline learning. In the online learning, every time the synapse memory 100 receives a set of data (or a part of all data), the weight of the synapse memory cell 10 receiving the set of data is updated using only the received set of data. In the offline learning, the weight of the respective synapse memory cells 10 is set based on data prepared in advance.

The switching portion 60 is connected to the read-write-column line $rw\_cl_0$ (the dendrite 30). The switching portion 60 may include a three position switch 61, a current sensor 63, and a connecting line 65. The switching portion 60 switches a circuit via the current sensor 63 or via the connecting line 65.

Hereinafter, operation of the synapse memory cell 100 will be explained. As mentioned above, the synapse memory cell 100 performs the read operation and the write operation. In the example shown in the figure, the read operation may include a normal direction read operation which is performed in both the recognition and the learning operations, and a reverse direction read operation which is performed in only the learning operation. Further, the write operation may include a normal increment write operation which is performed to increase the weight value stored in the memory device MD, and a normal decrement write operation which is performed to decrease the weight value stored in the memory device MD. Both these write operations are performed in the learning operation.

In the following, the normal direction read operation, the reverse direction read operation, the normal increment write operation, and the normal decrement write operation will be explained in this order.

Figure 4:
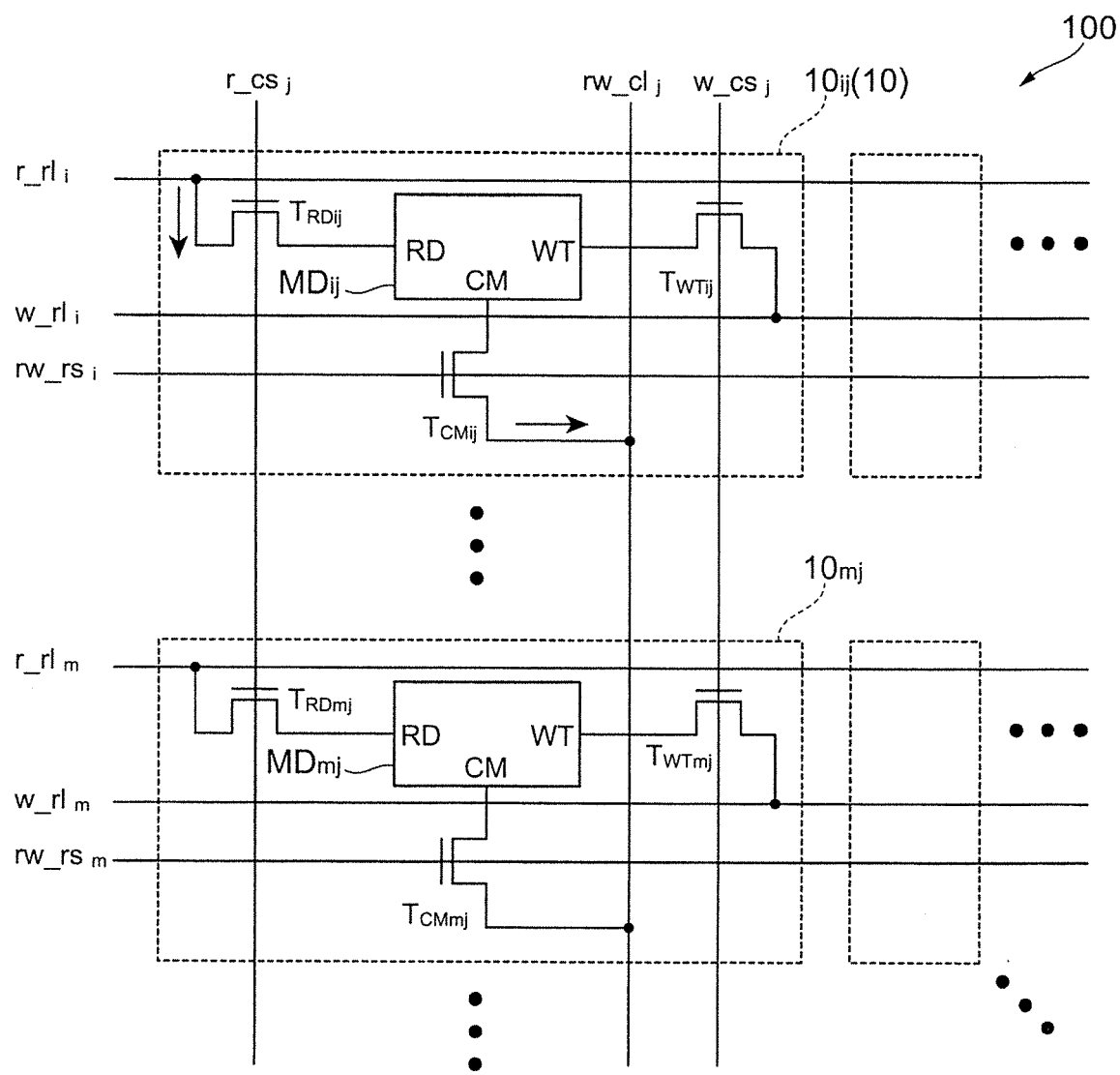
FIG. 4 depicts one synapse memory cell at i-th row and j-th column and another synapse memory cell at m-th row and j-th column in the normal direction read operation.
Figure 5:
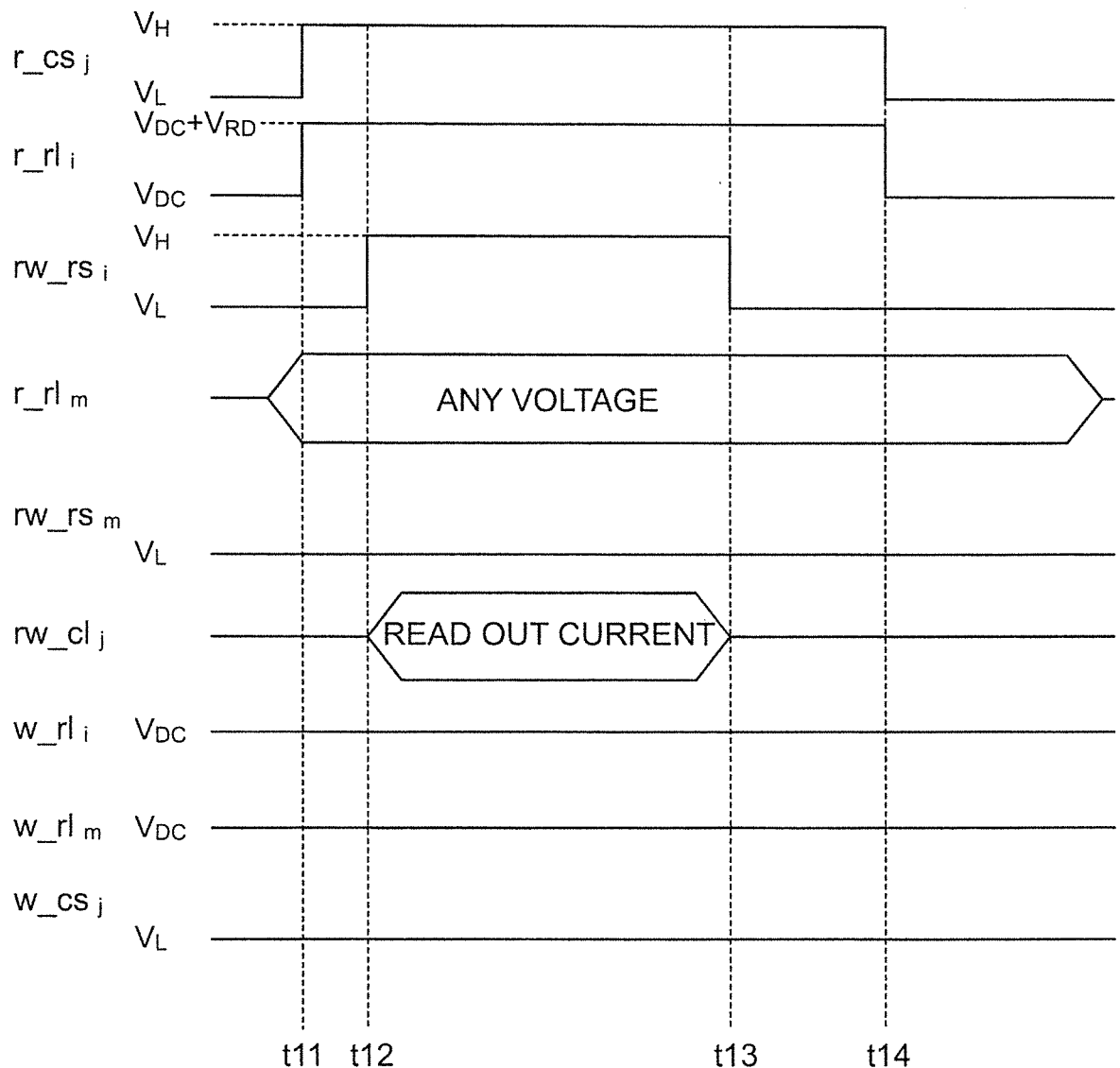
FIG. 5 depicts time charts of the normal direction read operation.

FIG. 4 depicts one synapse memory cell $10_{ij}$ at i-th row and j-th column and another synapse memory cell $10_{mj}$ at m-th row and j-th column in the normal direction read operation. FIG. 5 depicts time charts of the normal direction read operation.

Referring to FIGS. 4 and 5, the normal direction read operation of the synapse memory 100 will be explained. Here, the operation of the synapse memory cell $10_{ij}$ and the synapse memory cell $10_{mj}$ arranged along the column direction in the synapse memory 100 will be explained. The synapse memory cell $10_{ij}$ and the synapse memory cell $10_{mj}$ are an example of the claimed subgroup or the claimed second subgroup of the synapse memory cells. The present embodiment assumes that the synapse memory cell $10_{ij}$ is selected to be read and the synapse memory cell $10_{mj}$ is unselected to be read.

Firstly, at time t11, the transistor driver (not shown) applies the high voltage $V_H$ to the read-column select r_cs$_j$, so that the read transistors $T_{RDij}$, $T_{RDmj}$ are turned ON. Further, the read driver 40 (see FIG. 3) applies the read drive voltage $V_{DC}+V_{RD}$ to the read-row line r_rl$_i$. That is to say, the read driver 40 outputs the read signal (read voltage $V_{DC}+V_{RD}$) to the read terminal RD of the synapse memory cell $10_{ij}$.

Next, at time t12, the transistor driver applies the high voltage $V_H$ to the read-write-row select rw_rs$_i$, so that the common terminal CM of the memory device $MD_{ij}$ outputs the signal from the memory device $MD_{ij}$ that has received the read signal (read voltage) at its read terminal RD. This enables the current sensor 63 (see FIG. 3) provided on the read-write-column line rw_cl$_j$ to read out the current including the current from the memory device $MD_{ij}$.

Next, at time t13, the transistor driver applies the low voltage $V_L$ to the read-write-row select rw_rs$_i$. Further, at time t14, the transistor driver applies the low voltage $V_L$ to the read-column select r_cs$_j$, and the read driver 40 applies the supply voltage $V_{DC}$ to the read-row line r_r$_i$.

Note that at time t12, the transistor driver applies the low voltage $V_L$ to the read-write-row select rw_rs$_m$ while the transistor driver applies the high voltage $V_H$ to the read-write-row select rw_rs$_i$. That is to say, the common transistor $T_{CMmj}$ disconnects the memory device $MD_{mj}$ and the read-write-column line rw_cl$_j$. This prevents the common terminal CM of the memory device $MD_{mj}$ from outputting the signal from the memory device $MD_{mj}$, which is unselected to be read. Disconnecting the memory device $MD_{mj}$ unselected to be read and the read-write-column line rw_cl$_j$ enables to avoid the read disturb. In this example, the read-row line r_rl$_m$ may be in any voltage or a high-impedance. In other words, care for the voltage of the read-row line r_rl$_m$ is optional.

Figure 6:
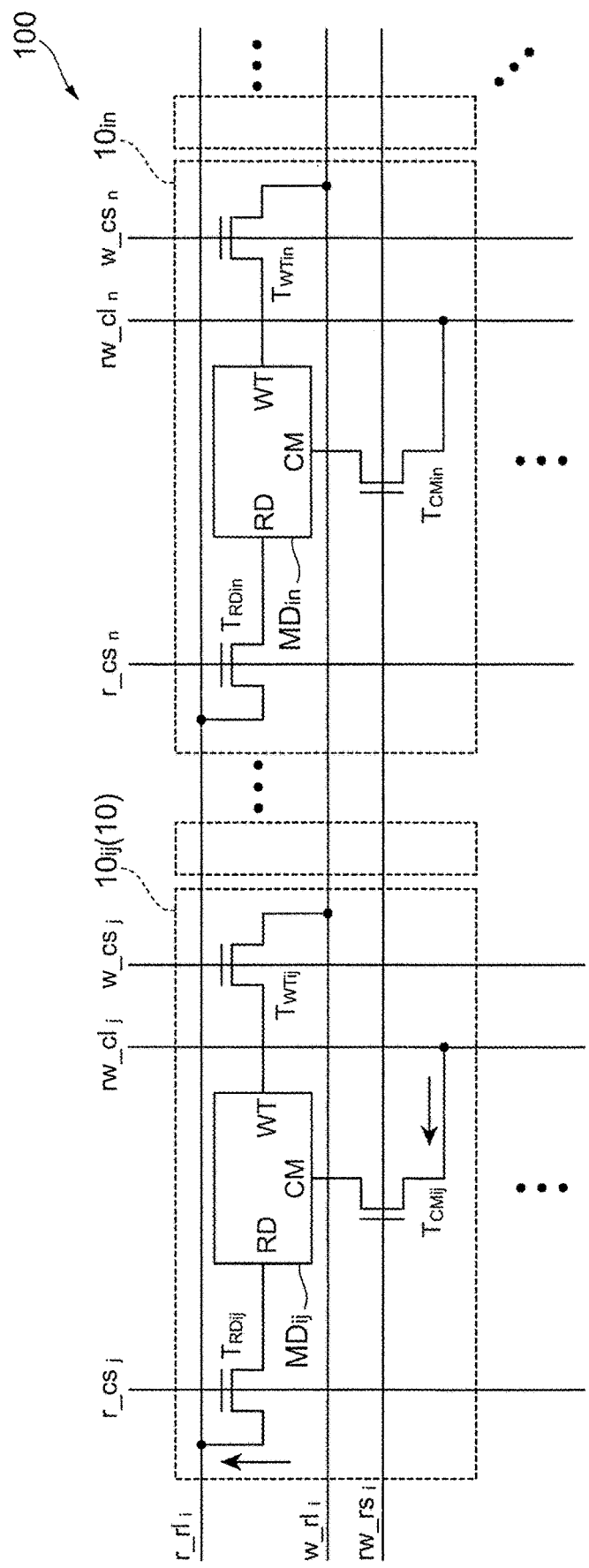
FIG. 6 depicts one synapse memory cell at i-th row and j-th column and another synapse memory cell at i-th row and n-th column in the reverse direction read operation.
Figure 7:
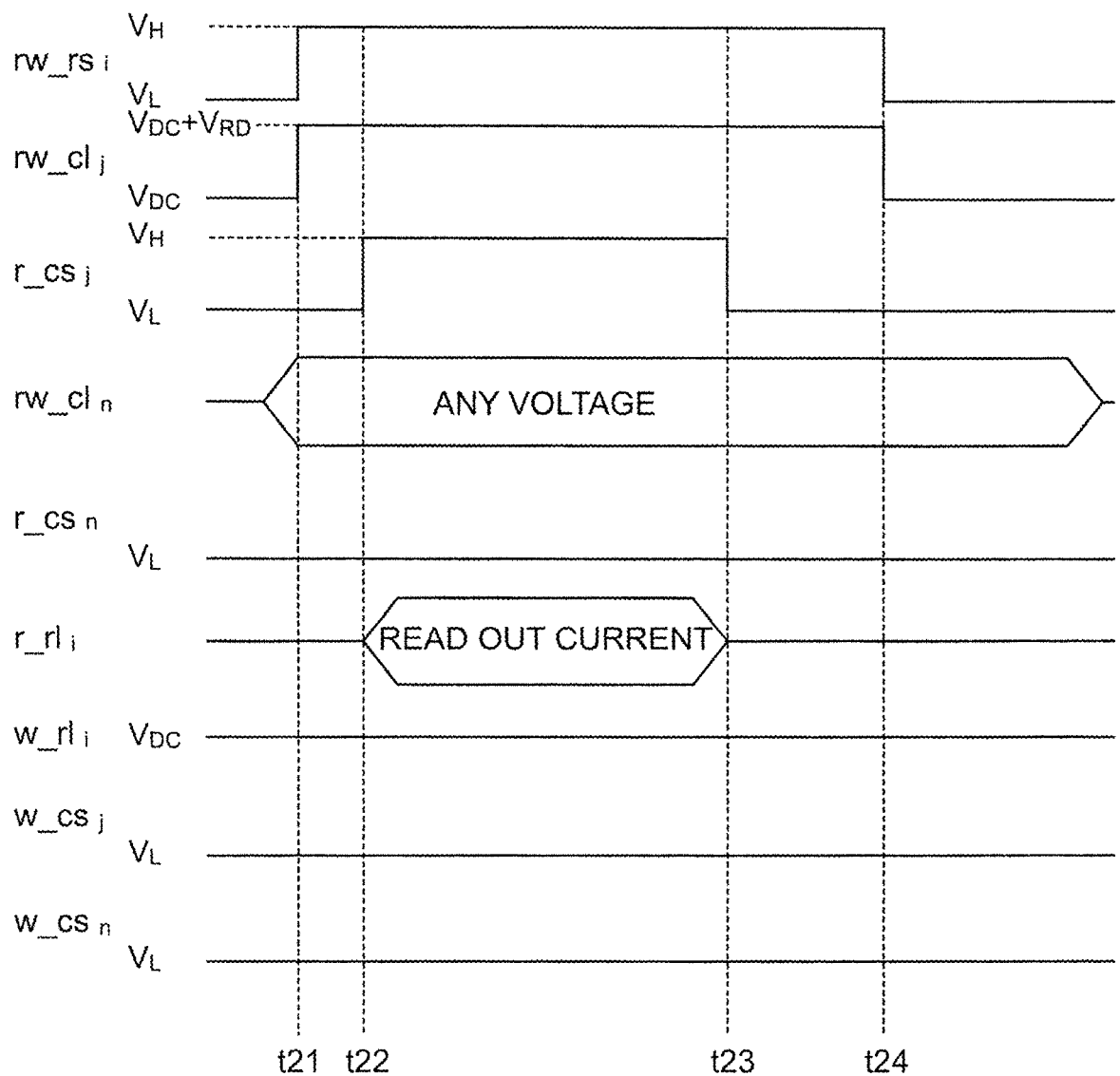
FIG. 7 depicts time charts of the reverse direction read operation.

FIG. 6 depicts one synapse memory cell $10_{ij}$ at i-th row and j-th column and another synapse memory cell $10_{in}$ at i-th row and n-th column in the reverse direction read operation. FIG. 7 depicts time charts of the reverse direction read operation.

Referring to FIGS. 6 and 7, the reverse direction read operation of the synapse memory 100 will be explained. Here, the operation of the synapse memory cell $10_{ij}$ and the synapse memory cell $10_{in}$ arranged along the row direction in the synapse memory 100 will be explained. The synapse memory cell $10_{ij}$ and the synapse memory cell $10_{in}$ are an example of the claimed subgroup or the first subgroup of the synapse memory cells. The present embodiment assumes that the synapse memory cell $10_{ij}$ is selected to be read and the synapse memory cell $10_{in}$ is unselected to be read. In the reverse direction read operation, the signal flows in a direction opposite to the normal direction read operation shown in FIG. 4.

Specifically, at time t21, the transistor driver (not shown) applies the high voltage $V_H$ to the read-write-row select rw_rs$_i$, so that the common transistors $T_{CMij}$, $T_{CMin}$ are turned ON. Further, the read-write-column line rw_cl$_j$ is applied with the read drive voltage $V_{DC}+V_{RD}$. That is to say, the memory device $MD_{ij}$ receives the read signal (read voltage) at its common terminal CM.

Next, at time t22, the transistor driver applies the high voltage $V_H$ to the read-column select r_cs$_j$, so that the read terminal RD of the memory device $MD_{ij}$ outputs the signal from the memory device $MD_{ij}$ that has received the read signal (read voltage) at its common terminal CM. The current from the memory device $MD_{ij}$ is read at the end of the read-row line r_rl$_i$.

Next, the transistor driver applies the low voltage $V_L$ to the read-column select r_cs$_j$ at time t23, and then applies the low voltage $V_L$ to the read-write-row select rw_rs$_i$ at time t24. Further, the read-write-column line rw_cl$_j$ is applied with the supply voltage $V_{DC}$ at time t24.

Note that at time t22, the transistor driver applies the low voltage $V_L$ to the read-column select r_cs$_n$ while the transistor driver applies the high voltage $V_H$ to the read-column select r_cs$_j$. That is to say, the read transistor $T_{RDin}$ disconnects the memory device $MD_{in}$ and the read-row line r_rl$_i$. This prevents the read terminal RD of the memory device $MD_{in}$ from outputting the signal from the memory device $MD_{in}$, which is unselected to be read. Disconnecting the memory device $MD_{in}$ unselected to be read and the read-row line r_rl$_i$ enables to avoid the read disturb. In this example, the read-write column line rw_cl$_n$ may be in any voltage or a high-impedance. In other words, care for the voltage of the read-write-column line rw_cl$_n$ is optional.

Figure 8:
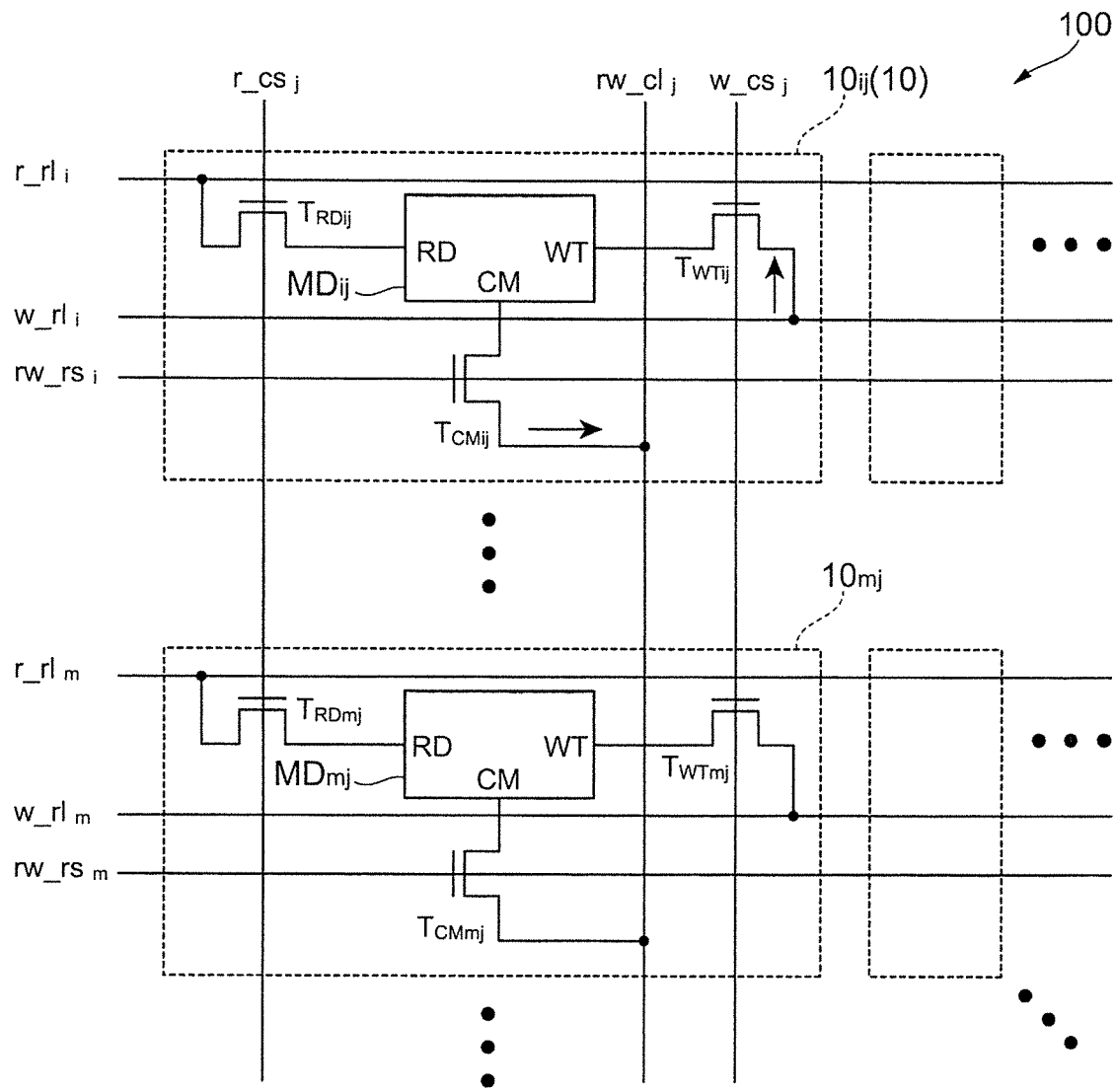
FIG. 8 depicts one synapse memory cell at i-th row and j-th column and another synapse memory cell at m-th row and j-th column in the normal increment write operation.
Figure 9:
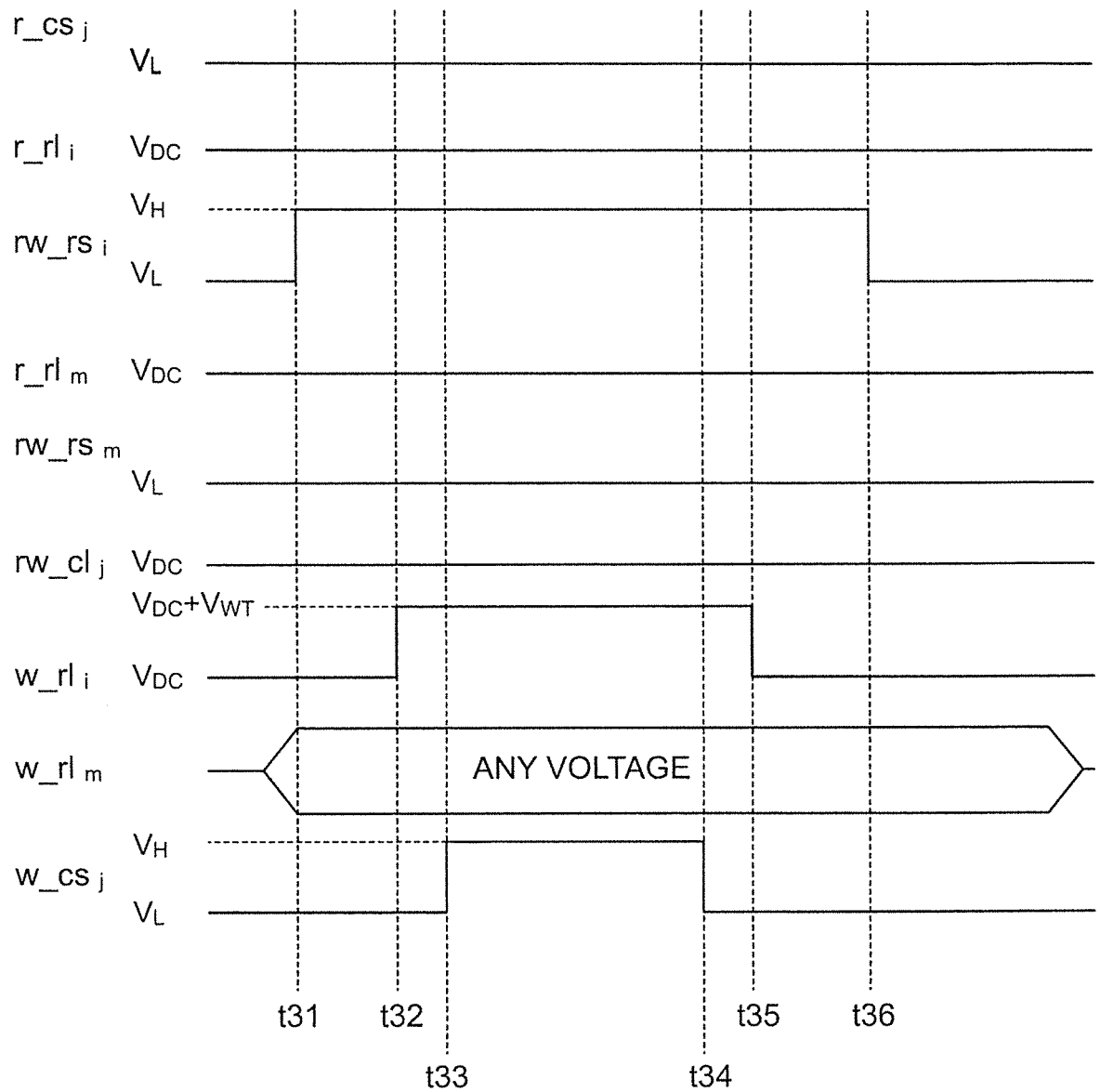
FIG. 9 depicts time charts of the normal increment write operation.

FIG. 8 depicts one synapse memory cell $10_{ij}$ at i-th row and j-th column and another synapse memory cell $10_{mj}$ at m-th row and j-th column in the normal increment write operation. FIG. 9 depicts time charts of the normal increment write operation.

Referring to FIGS. 8 and 9, the normal increment write operation of the synapse memory 100 will be explained. The present embodiment assumes that the synapse memory cell $10_{ij}$ is selected to be written and the synapse memory cell $10_{mj}$ is unselected to be written.

Firstly, at time t31, the transistor driver (not shown) applies the high voltage $V_H$ to the read-write-row select rw_rs$_i$, so that the common transistor $T_{CMij}$ is turned ON.

Next, at time t32, the write driver 50 (see FIG. 3) applies the increment write voltage $V_{DC}+V_{WT}$ to the write-row line w_rl$_i$.

Next, at time t33, the transistor driver applies the high voltage $V_H$ to the write-column select w_cs$_j$, so that the write transistor $T_{WTij}$ is turned ON. This enables the write terminal WT of the memory device $MD_{ij}$ to receive the increment write signal (write voltage $V_{DC}+V_{WT}$) from the write driver 50 to increase the weight value stored in the memory device $MD_{ij}$.

Next, at time t34, the transistor driver applies the low voltage $V_L$ to the write-column select w_cs$_j$. At time t35, the write driver 50 then applies the supply voltage $V_{DC}$ to the write-row line w_rl$_i$. At time t36, the transistor driver then applies the low voltage V$_L$ to the read-write-row select rw_rs$_i$.

Note that at time t31, the transistor driver applies the low voltage V$_L$ to the read-write-row select rw_rs$_m$ while the transistor driver applies the high voltage V$_H$ to the read-write-row select rw_rs$_i$. That is to say, the common transistor T$_{CMmj}$ disconnects the memory device MD$_{mj}$ and the read-write-column line rw_cl$_j$. This prevents the common terminal CM of the memory device MD$_{mj}$ from outputting the write current from the memory device MD$_{mj}$, which is unselected to be written. In this example, the write-row line w_rl$_m$ may be in any voltage or a high-impedance. In other words, care for the voltage of the write-row line w_rl$_m$ is optional.

Figure 10:
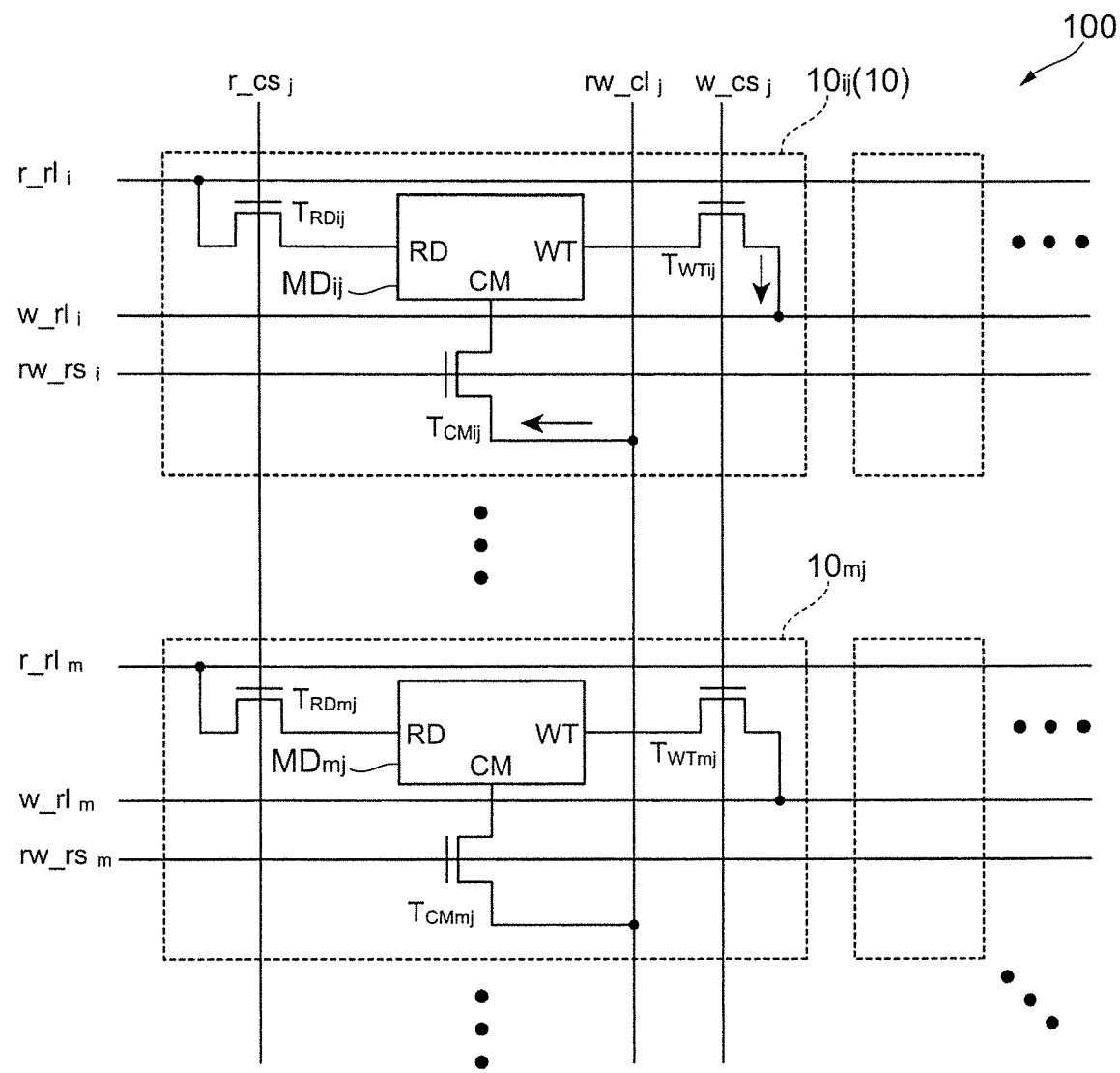
FIG. 10 depicts one synapse memory cell at i-th row and j-th column and another synapse memory cell at m-th row and j-th column in the normal decrement write operation.
Figure 11:
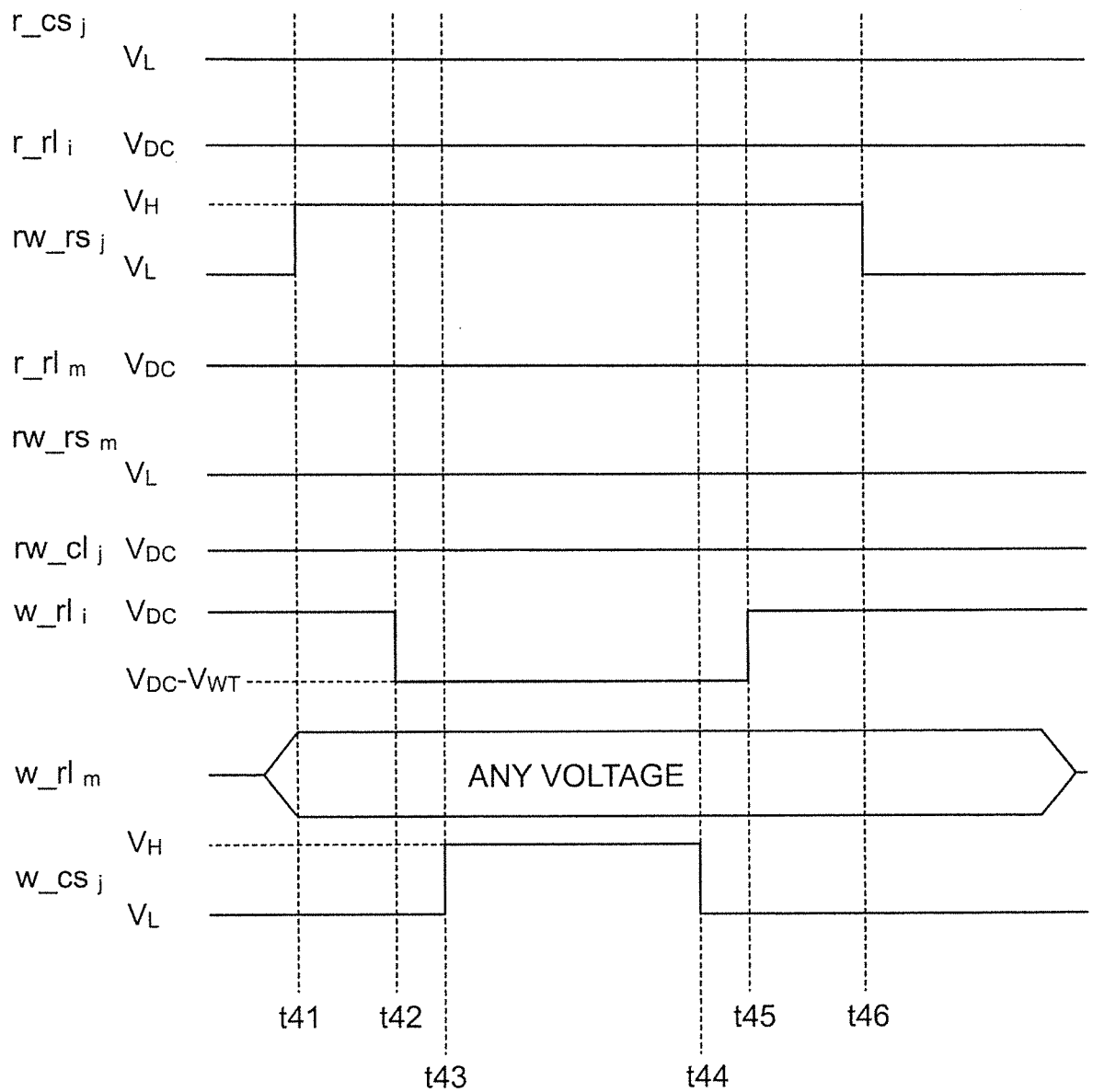
FIG. 11 depicts time charts of the normal decrement write operation.

FIG. 10 depicts one synapse memory cell 10$_{ij}$ at i-th row and j-th column and another synapse memory cell 10$_{mj}$ at m-th row and j-th column in the normal decrement write operation. FIG. 11 depicts time charts of the normal decrement write operation.

Referring to FIGS. 10 and 11, the normal decrement write operation of the synapse memory 100 will be explained. The present embodiment assumes that the synapse memory cell 10$_{ij}$ is selected to be written and the synapse memory cell 10$_{mj}$ is unselected to be written. The normal decrement write operation is generally the same as the above normal increment write operation shown in FIGS. 8 and 9 except for the applied voltage to the write-row line w_rl$_i$.

Firstly, at time t41, the transistor driver (not shown) applies the high voltage V$_H$ to the read-write-row select rw_rs$_i$, so that the common transistor T$_{CMij}$ is turned ON.

Next, at time t42, the write driver 50 (see FIG. 3) applies the decrement write voltage V$_{DC}$-V$_{WT}$ to the write-row line w_rl$_i$.

Next, at time t43, the transistor driver applies the high voltage V$_H$ to the write-column select w_cs$_j$, so that the write transistor T$_{WTij}$ is turned ON. This enables the write terminal WT of the memory device MD$_{ij}$ to receive the decrement write signal (write voltage V$_{DC}$-V$_{WT}$) from the write driver 50 to decrease the weight value stored in the memory device MD$_{ij}$.

Next, at time t44, the transistor driver applies the low voltage V$_L$ to the write-column select w_cs$_j$. At time t45, the write driver 50 then applies the supply voltage V$_{DC}$ to the write-row line w_rl$_i$. At time t46, the transistor driver then applies the low voltage V$_L$ to the read-write-row select rw_rs$_i$.

Note that at time t41, the transistor driver applies the low voltage V$_L$ to the read-write-row select rw_rs$_m$ while the transistor driver applies the high voltage V$_H$ to the read-write-row select rw_rs$_i$. This prevents the common terminal CM of the memory device MD$_{mj}$ from inputting the write current to the memory device MD$_{mj}$, which is unselected to be written. In this example, the write-row line w_rl$_m$ may be in any voltage or a high-impedance. In other words, care for the voltage of the write-row line w_rl$_m$ is optional.

As mentioned above, the common transistors T$_{CM}$ are used to prevent unselected memory devices MDs from connecting with the read-write-column lines rw_cl$_0$-rw_rs$_{n-1}$. This may address the read disturb problem and enable an array size to be larger. Further, the read operation and the write operation are implemented independently without any undesired input to the memory devices MDs and undesired output from the memory devices MDs.

Figure 12:
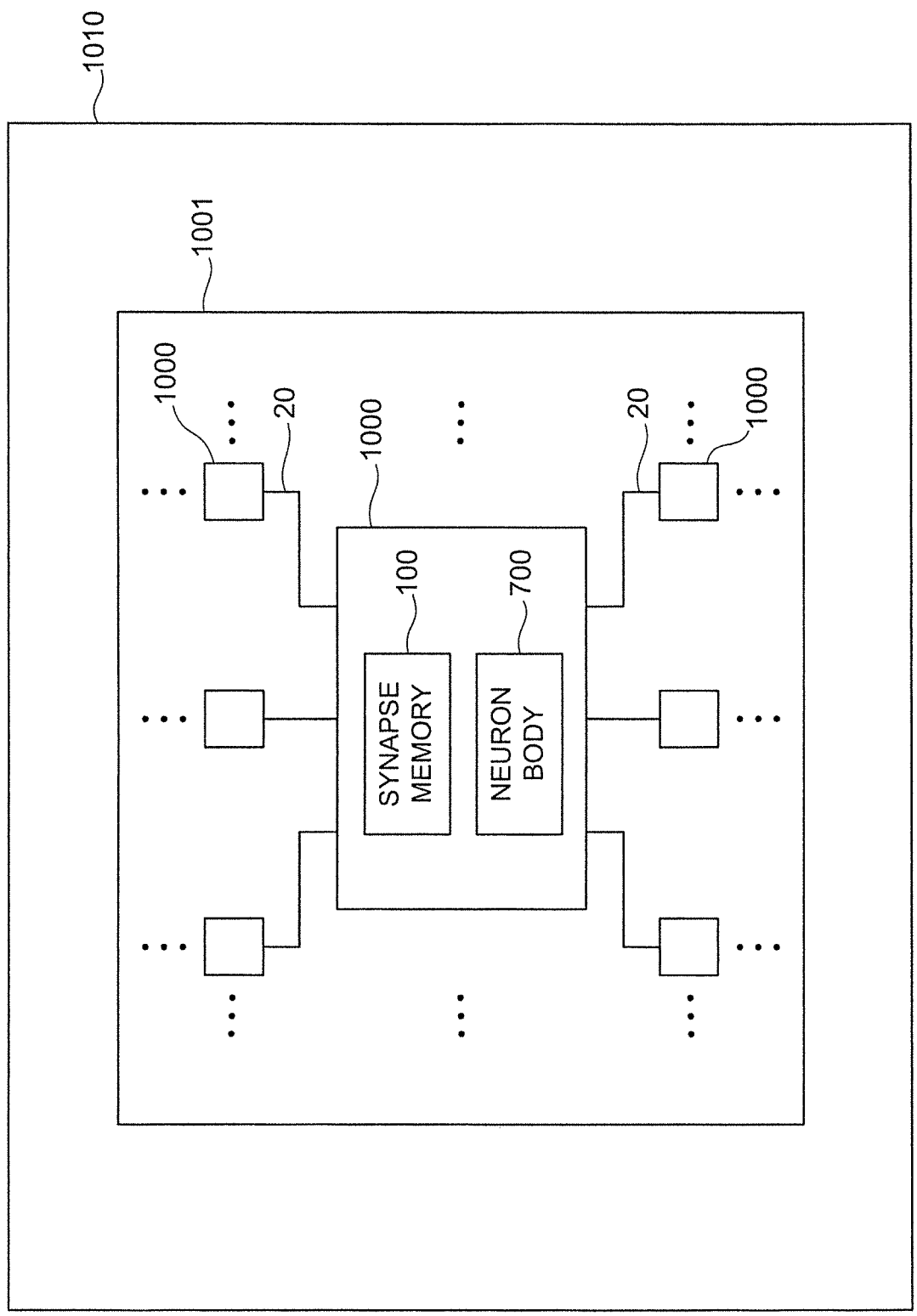
FIG. 12 depicts an example of a device which includes the synapse memory.

FIG. 12 depicts an example of a device 1010 which includes the synapse memory 100.

As shown in FIG. 12, the synapse memory 100 may be provided on the device 1010, such as a computer. In the shown example, multiple neuro-synaptic core systems 1000 are provided on a chip 1001, such as a semiconductor chip. The chip 1001 is then mounted on the device 1010.

Each of the neuro-synaptic core systems 1000 includes the synapse memory 100 and a neuron body 700. The neuron body 700 performs neuron operations. Specifically, the neuron body 700 obtains the product-sum value of the synapse weight value and input value based on the total current sensed by the current sensor 63 (see FIG. 3). The total current sensed by the current sensor 63 may represent the product-sum value of the synapse weight values stored in the synapse memory cells 10 on the cross points of the selected axon(s) 20 and the dendrites 30 and the input values. Then, the neuron body 700 outputs neuron output corresponding to the total current value.

Here, the neuro-synaptic core systems 1000 are connected to each other via the axons 20. The synapse memory 100 is connected to a pre-neuron via the axon 20. The neuron body 700 is a part of the post-neuron and its output is axon 20 which is connected to synapse memories 100 in the same or other neuro-synaptic core systems 1000. The synapse memory 100 receives an output signal from the pre-neuron to accumulate the weight values of the synapses whose inputs are activated via their axons 20. If the accumulated synapse weight value reaches a predetermined threshold, the neuron body 700 outputs the output signal as the neuron output of the post-neuron.

Figure 13:
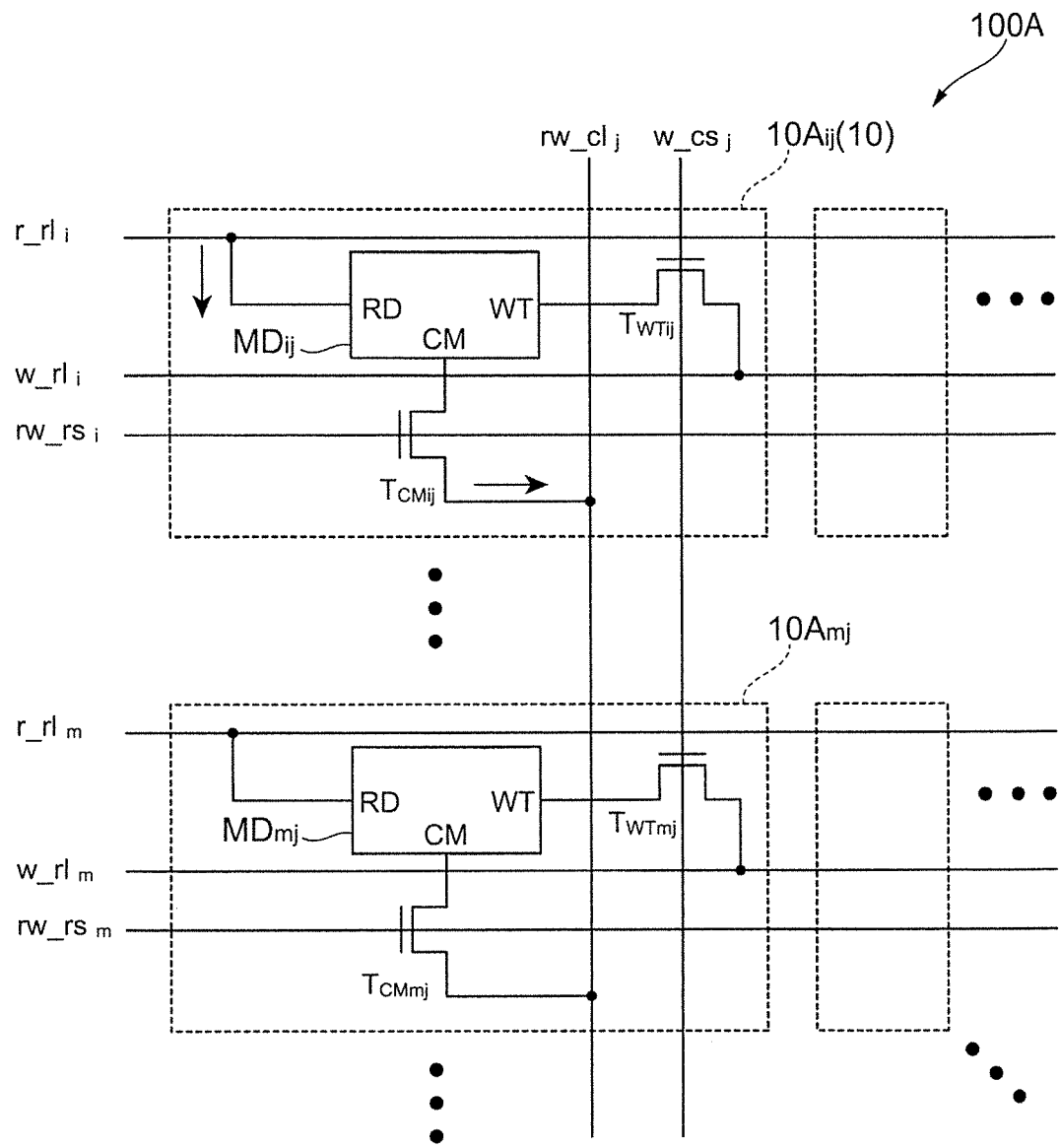
FIG. 13 depicts one synapse memory cell at i-th row and j-th column and another synapse memory cell at m-th row and j-th column in the normal direction read operation according to the second exemplary embodiment of the present invention.
Figure 14:
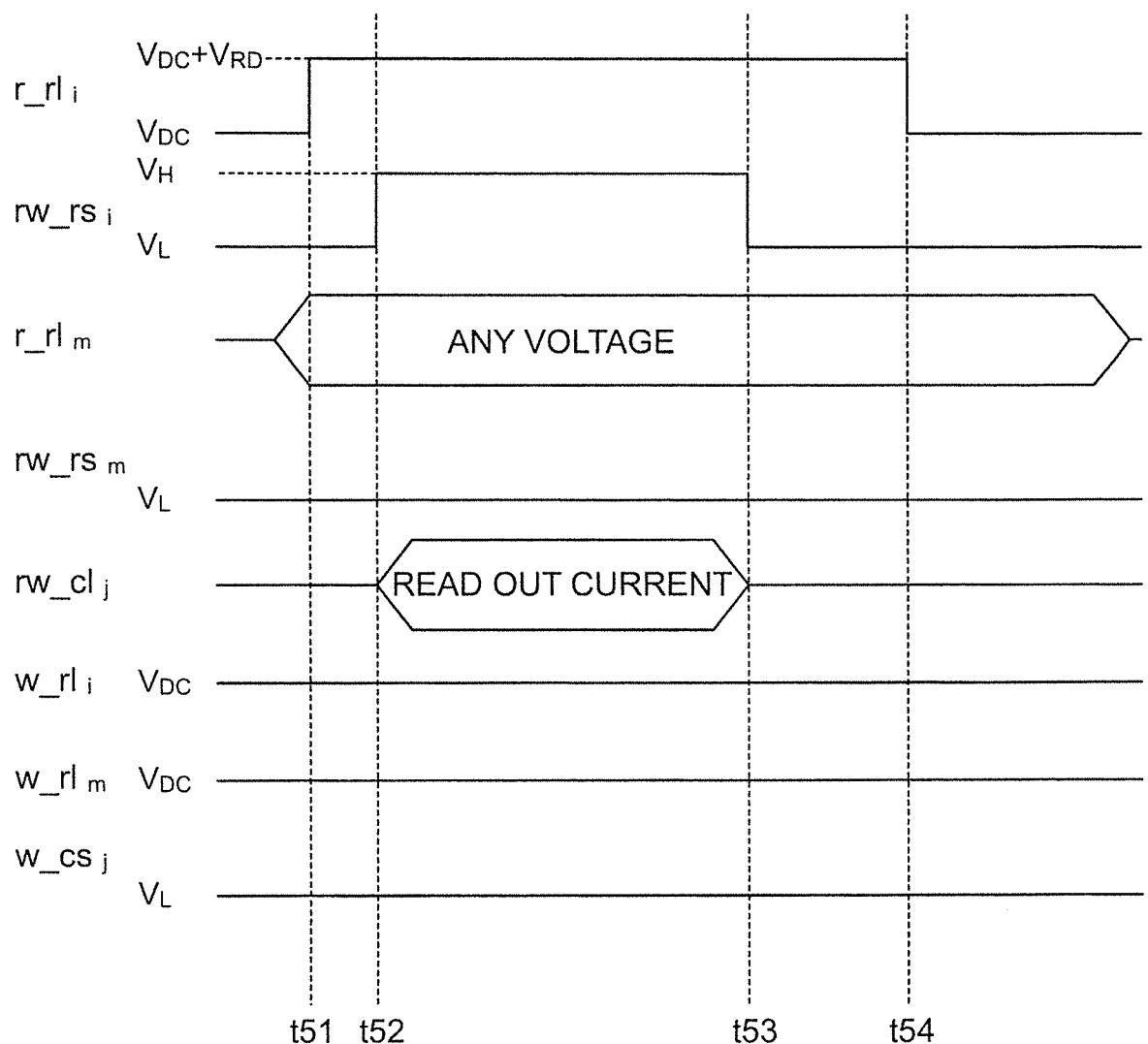
FIG. 14 depicts time charts of the normal direction read operation according to the second exemplary embodiment of the present invention.

FIG. 13 depicts one synapse memory cell 10A$_{ij}$ at i-th row and j-th column and another synapse memory cell 10A$_{mj}$ at m-th row and j-th column in the normal direction read operation according to the second exemplary embodiment of the present invention. FIG. 14 depicts time charts of the normal direction read operation according to the second exemplary embodiment of the present invention. In FIGS. 13 and 14, the same structures as those of the exemplary embodiment shown in FIG. 3 are denoted by the same reference numerals, and the detailed explanation thereof will be omitted.

The configuration of the synapse memory cell 10 is not limited to the above mentioned exemplary embodiment. For example, if the reverse direction read operation, i.e. the back propagation, is not required for the synapse memory 100, the synapse memory cell 10 may be configured as shown in FIG. 13.

In the synapse memory cell 10A$_{ij}$ and the synapse memory cell 10A$_{mj}$, the read transistor T$_{RD}$ (shown in FIG. 3) is not provided. In other words, the synapse memory cell 10A$_{ij}$ and the synapse memory cell 10A$_{mj}$ may respectively include two transistors, namely: the write transistor T$_{WT}$ and the common transistor T$_{CM}$.

A cell size of the synapse memory cell 10A$_{ij}$ (the synapse memory cell 10A$_{mj}$) may be smaller than the synapse memory cell 10 shown in FIG. 3 by a space for the read transistor T$_{RD}$. In other words, the synapse memory cells 10A$_{ij}$ and 10A$_{mj}$ are smaller than the synapse memory cell 10 by one (1) transistor space.

Further, in the synapse memory 100A, control of the read transistor T$_{RD}$ is not required. That is to say, timing control is simpler than the synapse memory shown in FIG. 3 due to fewer control signals.

Referring to FIGS. 13 and 14, the normal direction read operation of the synapse memory 100A will be explained. The second exemplary embodiment assumes that the synapse memory cell 10A$_{ij}$ is selected to be read and the synapse memory cell 10A$_{mj}$ is unselected to be read.

Firstly, at time t51, the read driver 40 (see FIG. 3) applies the read drive voltage $V_{DC}+V_{RD}$ to the read-row line r_rl$_i$. That is to say, the read driver 40 outputs the read signal to the synapse memory cell 10A$_{ij}$.

Next, at time t52, the transistor driver applies the high voltage $V_H$ to the read-write-row select rw_rs$_i$, so that the common terminal CM of the memory device MD$_{ij}$ outputs the signal from the memory device MD$_{ij}$ that has received the read signal. This enables the current sensor 63 (see FIG. 3) to read out the current including the current from the memory device MD$_{ij}$.

Next, at time t53, the transistor driver applies the low voltage $V_L$ to the read-write-row select rw_rs$_i$. Further, at time t54, the read driver 40 applies the supply voltage $V_{DC}$ to the read-row line r_rl$_i$.

Note that at time t52, the transistor driver applies the low voltage $V_L$ to the read-write-row select rw_rs$_m$ while the transistor driver applies the high voltage $V_H$ to the read-write-row select rw_rs$_i$. That is to say, the common transistor $T_{CMmj}$ disconnects the memory device MD$_{mj}$ and the read-write-column line rw_cl$_j$. This prevents the common terminal CM of the memory device MD$_{mj}$ from outputting the signal from the memory device MD$_{mj}$, which is unselected to be read.

Figure 15:
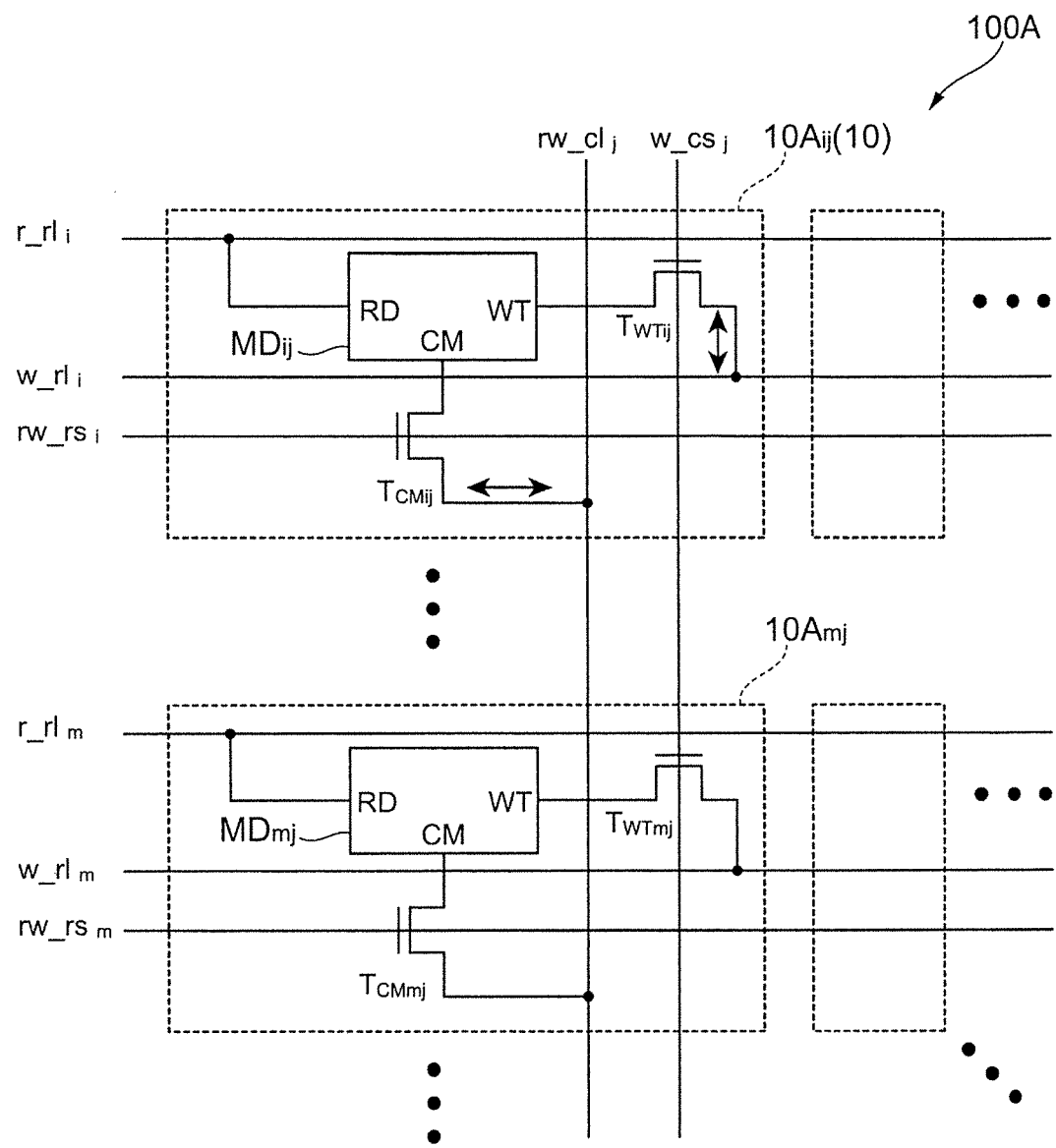
FIG. 15 depicts one synapse memory cell at i-th row and j-th column and another synapse memory cell at m-th row and j-th column in the normal write operation according to the second exemplary embodiment of the present invention.
Figure 16:
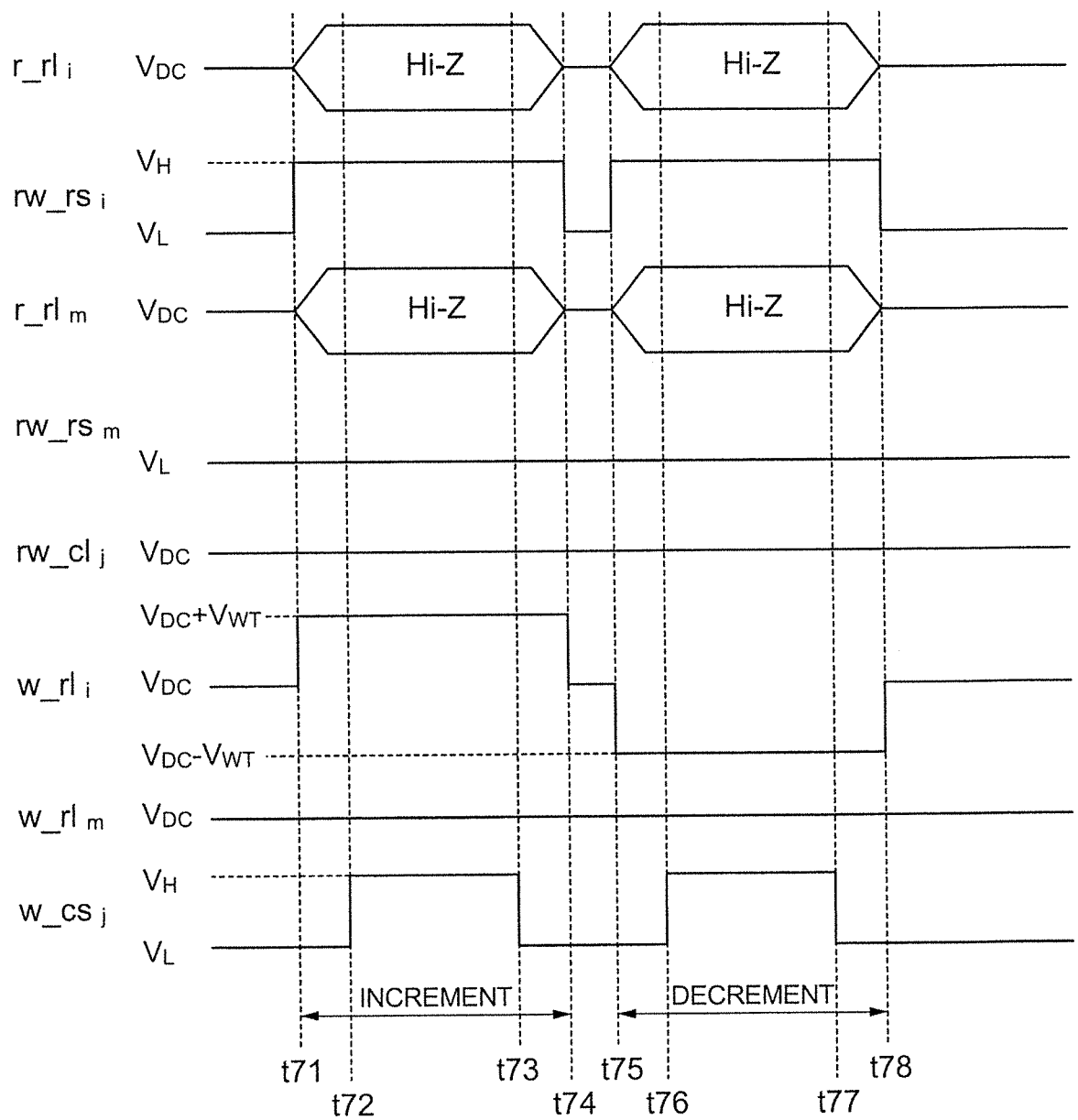
FIG. 16 depicts time charts of the normal write operation.

FIG. 15 depicts one synapse memory cell 10A$_{ij}$ at i-th row and j-th column and another synapse memory cell 10A$_{mj}$ at m-th row and j-th column in the normal write operation according to the second exemplary embodiment of the present invention. FIG. 16 depicts time charts of the normal write operation.

Referring to FIGS. 15 and 16, the normal write operation including the normal increment write operation and the normal decrement write operation of the synapse memory 100A will be explained. The present embodiment assumes that the synapse memory cell 10A$_{ij}$ is selected to be written and the synapse memory cell 10A$_{mj}$ is unselected to be written.

Firstly, at time t71, the transistor driver (not shown) applies the high voltage $V_H$ to the read-write-row select rw_rs$_i$, so that the common transistor $T_{CMij}$ is turned ON. Further, the write driver 50 (see FIG. 3) applies the increment write voltage $V_{DC}+V_{WT}$ to the write-row line w_rl$_i$.

Next, at time t72, the transistor driver applies the high voltage $V_H$ to the write-column select w_cs$_j$, so that the write transistor $T_{WTij}$ is turned ON. This enables the write terminal WT to receive the write signal from the write driver 50 to increase the weight value stored in the memory device MD$_{ij}$.

Next, at time t73, the transistor driver applies the low voltage $V_L$ to the write-column select w_cs$_j$, so that the write transistor $T_{WTij}$ is turned OFF.

Next, at time t74, the write driver 50 then applies the supply voltage $V_{DC}$ to the write-row line w_rl$_i$. Further, the transistor driver applies the low voltage $V_L$ to the read-write-row select rw_rs$_i$, so that the common transistor $T_{CMij}$ is turned OFF.

Next, at time t75, the transistor driver applies the high voltage $V_H$ to the read-write-row select rw_rs$_i$, so that the common transistor $T_{CMij}$ is turned ON. Further, the write driver 50 applies the decrement write voltage $V_{DC}-V_{WT}$ to the write-row line w_rl$_i$.

Next, at time t76, the transistor driver applies the high voltage $V_H$ to the write-column select w_cs$_j$, so that the write transistor $T_{WTij}$ is turned ON. This enables the write terminal WT of the memory device MD$_{ij}$ to receive the write signal from the write driver 50 to decrease the weight value stored in the memory device MD$_{ij}$.

Next, at time t77, the transistor driver applies the low voltage $V_L$ to the write-column select w_cs$_j$. Further, at time t78, the write driver 50 then applies the supply voltage $V_{DC}$ to the write-row line w_rl$_i$, and the transistor driver applies the low voltage $V_L$ to the read-write-row select rw_rs$_i$.

Figure 17:
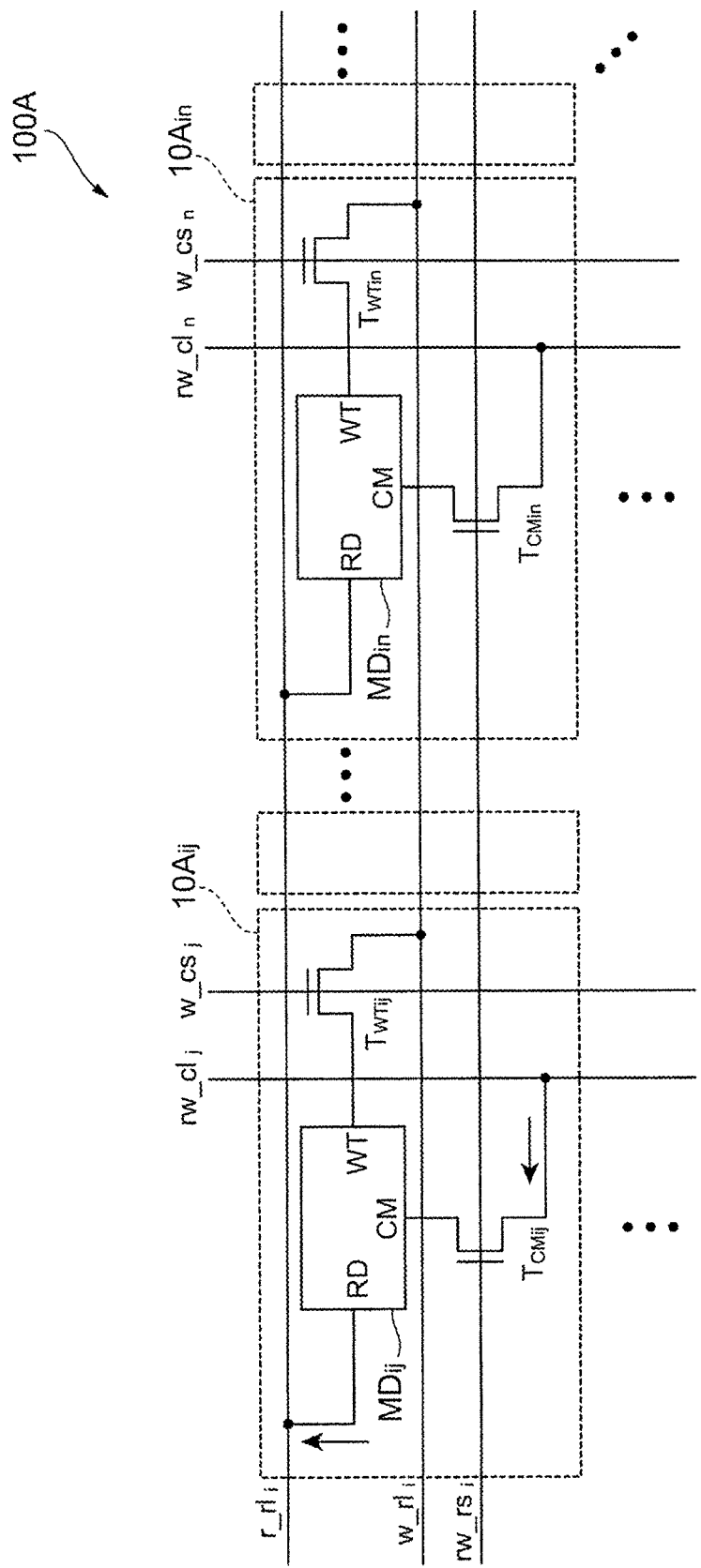
FIG. 17 depicts one synapse memory cell at i-th row and j-th column and another synapse memory cell at i-th row and n-th column in the reverse direction read operation according to the third exemplary embodiment of the present invention.
Figure 18:
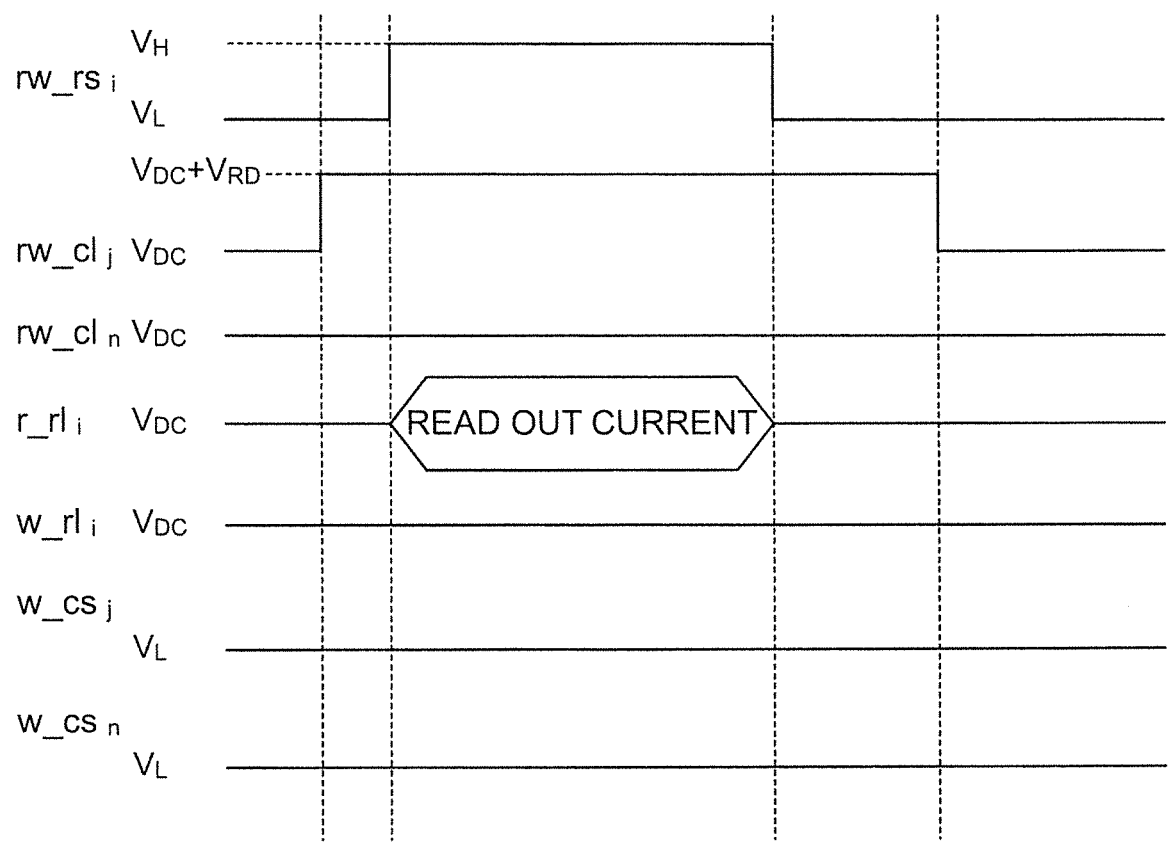
FIG. 18 depicts time charts of the reverse direction read operation according to the third exemplary embodiment of the present invention.

FIG. 17 depicts one synapse memory cell 10A$_{ij}$ at i-th row and j-th column and another synapse memory cell 10A$_{in}$ at i-th row and n-th column in the reverse direction read operation according to the second exemplary embodiment of the present invention. FIG. 18 depicts time charts of the reverse direction read operation according to the second exemplary embodiment of the present invention.

As shown in FIGS. 17 and 18, if the synapse memory 100A was required to conduct the reverse direction read operation (the back propagation operation), the read disturb would occur due to the influence of the memory cells 10 provided on the same read-row line r_rl$_i$ (the identical axon 20) as the synapse memory cell 10A$_{ij}$ to be read. To avoid the read disturb in the reverse direction read operation, the read transistor $T_{RD}$ (shown in FIG. 3) is required to be provided on the read terminal RD.

Next, an alternative exemplary embodiment will be described. In the above exemplary embodiments, the memory device MD is the MRAM. As long as the memory device MD is the three terminal device, the memory device MD can be another device. For example, the memory device MD can be a nonvolatile random access memory (NVRAM), such as a flash memory, a ferroelectric random access memory (FeRAM), a phase change random access memory (PRAM), and a resistive random access memory (ReRAM).

In the above exemplary embodiment, three transistors, i.e. the read transistor $T_{RD}$, the write transistor $T_{WT}$, and the common transistor $T_{CM}$, are explained as switching elements, i.e. switches, for the memory device MD. The transistor is not limited to a specific transistor. For example, the transistor can be a metal oxide semiconductor field effect transistor or a bipolar transistor. Alternatively, a diode or a thyristor can be provided instead of the transistor as long as such an element is capable of switching the circuits of the memory device MD.

In the above exemplary embodiment, one read driver 40 and one write driver 50 are provided for one axon 20. However, the one read driver 40 and the one write driver 50 are not required to be provided for each axon 20 dedicatedly. In other words, the read driver 40 and the write driver 50 can be provided for multiple axons 20. That is to say, the number of the read drivers 40 and the write drivers 50 can be equal to or less than the number of the axons 20.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A synapse memory comprising a plurality of synapse memory cells provided at cross points of a plurality of axon lines and a plurality of dendrite lines, wherein
each synapse memory cell comprises:
a memory device configured to store a weight value, the memory device being provided with a read terminal, a write terminal, and a common terminal, the read terminal being configured to receive a read signal to read the weight value stored in the memory device, the write terminal being configured to receive a write signal to write the weight value to the memory device, the common terminal being configured to output an output signal from the memory device having received the read signal or to input an input signal to the memory device having received the write signal;
a write transistor provided between the write terminal of the memory device and a write signal line configured to send the write signal;
a common transistor provided between the common terminal of the memory device and one of the dendrite lines,
a read transistor provided between the read terminal of the memory device and one of the plurality of axon lines,
wherein each of the write transistor, the common transistor, and the read transistor are provided between separate, independent ports of the memory device and row and column access lines.

2. The synapse memory according to claim 1, wherein the memory device is a magnetoresistive random access memory (MRAM).

3. The synapse memory according to claim 1, wherein
a subgroup of the synapse memory cells is connected in common to one of the plurality of axon lines, and
a gate of the common transistor provided in each of the subgroup of the synapse memory cells is connected in common to a common control line configured to send a common transistor control signal.

4. The synapse memory according to claim 1, wherein
a subgroup of the synapse memory cells is connected in common to one of the plurality of dendrite lines, and
a gate of the write transistor provided in each of the subgroup of the synapse memory cells is connected in common to one of a plurality of the write control lines.

5. The synapse memory according to claim 1, wherein a subgroup of the synapse memory cells is connected in common to one of the plurality of dendrite lines, and a gate of the read transistor provided in each of the subgroup of the synapse memory cells is connected in common to a read signal line configured to send a read transistor control signal.

6. The synapse memory according to claim 1, wherein if the weight value stored in a part of the plurality of the synapse memory cells is to be read, each common transistor provided in the part of the plurality of the synapse memory cells is turned on and each common transistor provided in at least one of the other part of the plurality of the synapse memory cells is turned off.

7. The synapse memory according to claim 6, wherein
if the weight value stored in the part of the plurality of the synapse memory cells is to be read, each read transistor provided in the part of the plurality of the synapse memory cells is turned on and each write transistor provided in the part of the plurality of the synapse memory cells is turned off.

8. The synapse memory according to claim 1, wherein if the weight value is to be written in a part of the plurality of the synapse memory cells, each common transistor provided in the part of the plurality of the synapse memory cells is turned on and each common transistor provided in at least one of the other part of the plurality of the synapse memory cells is turned off.

9. The synapse memory according to claim 8, wherein
if the weight value is to be written in the part of the plurality of the synapse memory cells, each read transistor provided in the part of the plurality of the synapse memory cells is turned off and each write transistor provided in the part of the plurality of the synapse memory cells is turned on.

10. A synapse memory comprising a plurality of synapse memory cells provided at cross points of a plurality of axon lines and a plurality of dendrite lines, wherein
each synapse memory cell comprises:
a memory device configured to store a weight value, the memory device being provided with a read terminal, a write terminal, and a common terminal, the read terminal being configured to receive a read signal to read the weight value stored in the memory device, the write terminal being configured to receive a write signal to write the weight value to the memory device, the common terminal being configured to output an output signal from the memory device having received the read signal or to input an input signal to the memory device having received the write signal; and
one or more switches configured to switch connection and disconnection between one of the plurality of dendrite lines and the common terminal of the memory device, the switches being one or more of a write transistor, a read transistor, and a common transistor; and
if the weight value stored in a part of the plurality of the synapse memory cells is to be read, each switch provided in the part of the plurality of the synapse memory cells connects the one of the plurality of dendrite lines and the common terminal of the memory device, and each switch provided in at least one of the other part of the plurality of the synapse memory cells disconnects the one of the plurality of dendrite lines and the common terminal of the memory device,
wherein each of the write transistor, the common transistor, and the read transistor are provided between separate, independent ports of the memory device and row and column access lines.

11. A device comprising a synapse memory, wherein:
the synapse memory comprises a plurality of synapse memory cells provided at cross points of a plurality of axon lines and a plurality of dendrite lines, and
each synapse memory cell comprises:
a memory device configured to store a weight value, the memory device being provided with a read terminal, a write terminal, and a common terminal, the read terminal being configured to receive a read signal to read the weight value stored in the memory device, the write terminal being configured to receive a write signal to write the weight value to the memory device, the common terminal being configured to output an output signal from the memory device having received the read signal or to input an input signal to the memory device having received the write signal;
a write transistor provided between the write terminal of the memory device and a write signal line configured to send the write signal;
a common transistor provided between the common terminal of the memory device and one of the plurality of dendrite lines a read transistor provided between the read terminal of the memory device and one of the plurality of axon lines,
wherein each of the write transistor, the common transistor, and the read transistor are provided between separate, independent ports of the memory device and row and column access lines.

12. A synapse memory comprising a plurality of synapse memory cells provided at cross points of a plurality of axon lines and a plurality of dendrite lines, wherein
each synapse memory cell comprises:
a memory device configured to store a weight value, the memory device being provided with a read terminal, a write terminal, and a common terminal, the read terminal being configured to receive a read signal to read the weight value stored in the memory device, the write terminal being configured to receive a write signal to write the weight value to the memory device, the common terminal being configured to output an output signal from the memory device having received the read signal or to input an input signal to the memory device having received the write signal;
a write transistor provided between the write terminal of the memory device and a write signal line configured to send the write signal;
a common transistor provided between the common terminal of the memory device and one of the plurality of dendrite lines; and
a read transistor provided between the read terminal of the memory device and one of the plurality of axon lines,
a first subgroup of the synapse memory cells is connected in common to one of the plurality of axon lines,
a second subgroup of the synapse memory cells is connected in common to one of the plurality of dendrite lines,
a gate of the common transistor provided in each of the first subgroup of the synapse memory cells is connected in common to a common control line configured to send a common transistor control signal,
a gate of the write transistor provided in each of the second subgroup of the synapse memory cells is connected in common to one of the write control lines, and
a gate of the read transistor provided in each of the second subgroup of the synapse memory cells is connected in common to a read control line configured to send a read transistor control signal
wherein each of the write transistor, the common transistor, and the read transistor are provided between separate, independent ports of the memory device and row and column access lines.

13. A method for reading a weight value stored in a synapse memory, wherein
the synapse memory comprises a plurality of synapse memory cells provided at cross points of a plurality of axon lines and a plurality of dendrite lines,
each synapse memory cell comprises:
a memory device configured to store a weight value, the memory device being provided with a read terminal, a write terminal, and a common terminal, the read terminal being configured to receive a read signal to read the weight value stored in the memory device, the write terminal being configured to receive a write signal to write the weight value to the memory device, the common terminal being configured to output an output signal from the memory device having received the read signal or to input an input signal to the memory device having received the write signal;
a write transistor provided between the write terminal of the memory device and a write signal line configured to send the write signal;
a common transistor provided between the common terminal of the memory device and one of the plurality of dendrite lines; and
a read transistor provided between the read terminal of the memory device and one of the plurality of axon lines,
wherein each of the write transistor, the common transistor, and the read transistor are provided between separate, independent ports of the memory device and row and column access lines; and
reading the weight value of a part of the plurality of the synapse memory cells in a state where the write transistor is turned off, the common transistor is turned on, and the read transistor is turned on.

* * * * *